United States Patent
Kim

(10) Patent No.: US 9,704,935 B2
(45) Date of Patent: Jul. 11, 2017

(54) LIGHT-EMITTING DISPLAY DEVICE AND METHOD OF MANUFACTURING THE SAME

(71) Applicant: SAMSUNG DISPLAY CO., LTD., Yongin-si, Gyeonggi-Do (KR)

(72) Inventor: Geun Tak Kim, Hwaseong-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/884,800

(22) Filed: Oct. 16, 2015

(65) Prior Publication Data
US 2016/0284776 A1 Sep. 29, 2016

(30) Foreign Application Priority Data
Mar. 24, 2015 (KR) .................. 10-2015-0040551

(51) Int. Cl.
*H01L 51/56* (2006.01)
*H01L 27/32* (2006.01)

(52) U.S. Cl.
CPC ........ *H01L 27/3258* (2013.01); *H01L 27/326* (2013.01); *H01L 27/3246* (2013.01); *H01L 2227/323* (2013.01)

(58) Field of Classification Search
CPC ............. H01L 27/3258; H01L 27/3246; H01L 27/326; H01L 2227/323; H01L 51/5096; H01L 51/56; H01L 27/3211
See application file for complete search history.

(56) References Cited

U.S. PATENT DOCUMENTS

2006/0097264 A1* 5/2006 Kim .................... H01L 51/5265
257/72
2006/0223221 A1* 10/2006 Ishii .................... H01L 51/0007
438/99

FOREIGN PATENT DOCUMENTS

| JP | 2007-095512 A | 4/2007 |
|---|---|---|
| KR | 10-2003-0058151 A | 7/2003 |
| KR | 10-2003-0070627 A | 9/2003 |
| KR | 10-2005-0048437 A | 5/2005 |
| KR | 10-2005-0087115 A | 8/2005 |
| KR | 10-2011-0060488 A | 6/2011 |

* cited by examiner

*Primary Examiner* — Kyoung Lee
(74) *Attorney, Agent, or Firm* — Lee & Morse, P.C.

(57) ABSTRACT

A light-emitting display device, including a substrate including a plurality of pixels; a first electrode on the substrate in each of the pixels; a pixel defining layer on the substrate, the pixel defining layer having an opening exposing the first electrode and including a side surface having a first part, a second part located on the first part, and a boundary part located between the first part and the second part; a lyophobic pattern in the boundary part of the side surface of the pixel defining layer in the opening of the pixel defining layer; an organic layer on the first electrode, the organic layer including a light-emitting layer under the lyophobic pattern in the opening of the pixel defining layer; and a second electrode on the organic layer.

17 Claims, 15 Drawing Sheets

LIGHT-EMITTING DISPLAY DEVICE AND METHOD OF MANUFACTURING THE SAME

CROSS-REFERENCE TO RELATED APPLICATION

Korean Patent Application No. 10-2015-0040551, filed on Mar. 24, 2015, in the Korean Intellectual Property Office, and entitled: "Light-Emitting Display Device and Method of Manufacturing the Same," is incorporated by reference herein in its entirety.

BACKGROUND

1. Field

Embodiments relate to a light-emitting display device and a method of manufacturing the same.

2. Description of the Related Art

Among light-emitting display devices, organic light-emitting display devices, which may be self-luminous display devices, may exhibit wide viewing angle, high contrast, and fast response speed.

An organic light-emitting display device may include an organic light-emitting layer made of an organic light-emitting material between an anode and a cathode. Positive and negative voltages may respectively be applied to these electrodes, holes may move from the anode to the organic light-emitting layer via a hole injection layer and a hole transport layer, and electrons may move from the cathode to the organic light-emitting layer via an electron injection layer and an electron transport layer. The electrons and the holes may recombine in the organic light-emitting layer to generate excitons. The excitons may change from an excited state to a ground state, the organic light-emitting layer may emit light, and an image may be displayed on the organic light-emitting display device.

SUMMARY

Embodiments may be realized by providing a light-emitting display device, including a substrate including a plurality of pixels; a first electrode on the substrate in each of the pixels; a pixel defining layer on the substrate, the pixel defining layer having an opening exposing the first electrode and including a side surface having a first part, a second part located on the first part, and a boundary part located between the first part and the second part; a lyophobic pattern in the boundary part of the side surface of the pixel defining layer in the opening of the pixel defining layer; an organic layer on the first electrode, the organic layer including a light-emitting layer under the lyophobic pattern in the opening of the pixel defining layer; and a second electrode on the organic layer.

The lyophobic pattern may be formed as a ring pattern.

The lyophobic pattern may contact an end of the light-emitting layer.

The lyophobic pattern may include an insulating material that contains fluorine.

The organic layer may further include one or more of a hole injection layer between the first electrode and the light-emitting layer and under the lyophobic pattern in the opening of the pixel defining layer, a hole transport layer between the hole injection layer and the light-emitting layer and under the lyophobic pattern in the opening of the pixel defining layer, an electron transport layer between the light-emitting layer and the second electrode, or an electron injection layer between the electron transport layer and the second electrode.

The pixel defining layer may include an organic material or an inorganic material.

Embodiments may be realized by providing a light-emitting display device, including a substrate including a first pixel and a second pixel; a first electrode on the substrate in each of the first and second pixels; a pixel defining layer on the substrate, the pixel defining layer having a first opening exposing the first electrode of the first pixel and a second opening exposing the first electrode of the second pixel; a first lyophobic pattern in the first opening of the pixel defining layer and at a first location on a side surface of the pixel defining layer, the first location being relative to a height of the pixel defining layer; a second lyophobic pattern in the second opening of the pixel defining layer and at a second location on the side surface of the pixel defining layer, the second location being relative to the height of the pixel defining layer; a first organic layer including a first light-emitting layer under the first lyophobic pattern in the first opening of the pixel defining layer; a second organic layer including a second light-emitting layer under the second lyophobic pattern in the second opening of the pixel defining layer; and a second electrode on the first organic layer and the second organic layer.

Each of the first lyophobic pattern and the second lyophobic pattern may be formed as a ring pattern.

The first lyophobic pattern may contact an end of the first light-emitting layer, and the second lyophobic pattern may contact an end of the second light-emitting layer.

Each of the first lyophobic pattern and the second lyophobic pattern may include an insulating material that contains fluorine.

The second location may be lower than the first location, and a thickness of the second organic layer may be smaller than a thickness of the first organic layer.

The second location and the first location may be at a same height relative to the height of the pixel defining layer; and a thickness of the second organic layer may be equal to a thickness of the first organic layer.

The first pixel and the second pixel may emit light of different colors.

The pixel defining layer may include an organic material or an inorganic material.

Embodiments may be realized by providing a method of manufacturing a light-emitting display device, the method including forming a first electrode on a substrate having a plurality of pixels in each of the pixels; forming a pixel defining layer on the substrate, the pixel defining layer having an opening exposing the first electrode and a side surface including a first part, a second part located on the first part, and a boundary part located between the first part and the second part; forming a lyophobic pattern in the boundary part of the side surface of the pixel defining layer in the opening of the pixel defining layer; forming an organic layer, the organic layer including a light-emitting layer under the lyophobic pattern in the opening of the pixel defining layer, on the first electrode; and forming a second electrode on the organic layer.

Forming the lyophobic pattern may include filling the opening of the pixel defining layer with a first solvent up to a first location between the first part and the boundary part; ejecting a second solvent mixed with a fluorine-containing insulating material onto the first solvent; agglomerating the fluorine-containing insulating material at the first location by drying the second solvent; and having a pinning point formed by the lyophobic pattern formed at the first location by drying the first solvent.

The first solvent may be non-polar, and the second solvent may be polar.

The pixels may include a first pixel and a second pixel, the opening of the pixel defining layer may be divided into a first opening exposing the first electrode formed in the first pixel and a second opening exposing the first electrode formed in the second pixel, and forming the lyophobic pattern may include filling the first opening of the pixel defining layer with a first solvent up to a first location on a side surface of the pixel defining layer, the first location being relative to a height of the pixel defining layer, and the second opening of the pixel defining layer with the first solvent up to a second location on the side surface of the pixel defining layer, the second location being relative to the height of the pixel defining layer; ejecting a second solvent mixed with a fluorine-containing insulating material onto the first solvent in each of the first opening of the pixel defining layer and the second opening of the pixel defining layer; agglomerating the fluorine-containing insulating material at the first location and the second location by drying the second solvent; and having a first pinning point formed by a first lyophobic pattern formed at the first location and a second pinning point formed by a second lyophobic pattern formed at the second location by drying the first solvent in each of the first opening of the pixel defining layer and the second opening of the pixel defining layer.

Forming the light-emitting layer of the organic layer may include ejecting a first light-emitting solution into the first opening and a second light-emitting solution into the second opening by adjusting a volume of the first light-emitting solution and a volume of the second light-emitting solution such that a maximum height between the first pinning point and a surface of the first light-emitting solution in the first opening is equal to a maximum height between the second pinning point and a surface of the second light-emitting solution in the second opening.

The first solvent in each of the first opening of the pixel defining layer and the second opening of the pixel defining layer may be non-polar, and the second solvent may be polar.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
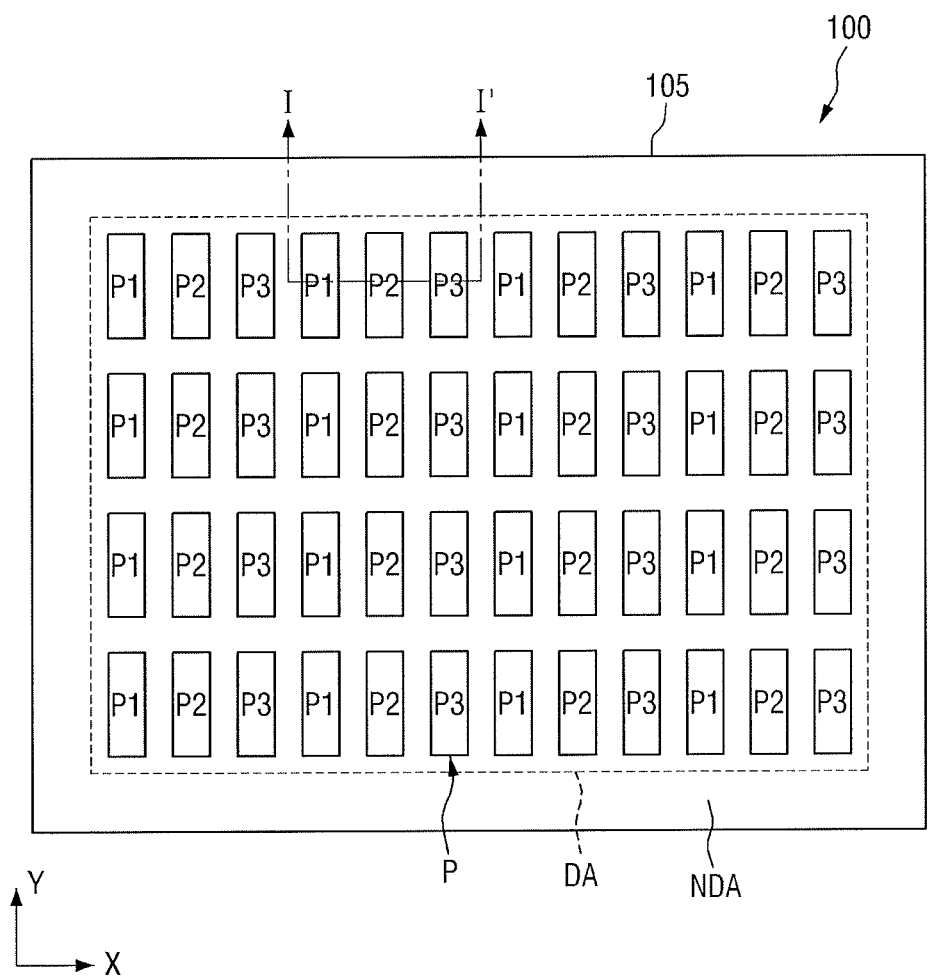
FIG. 1 illustrates a schematic plan view of pixels of a light-emitting display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section.

Figure 2:
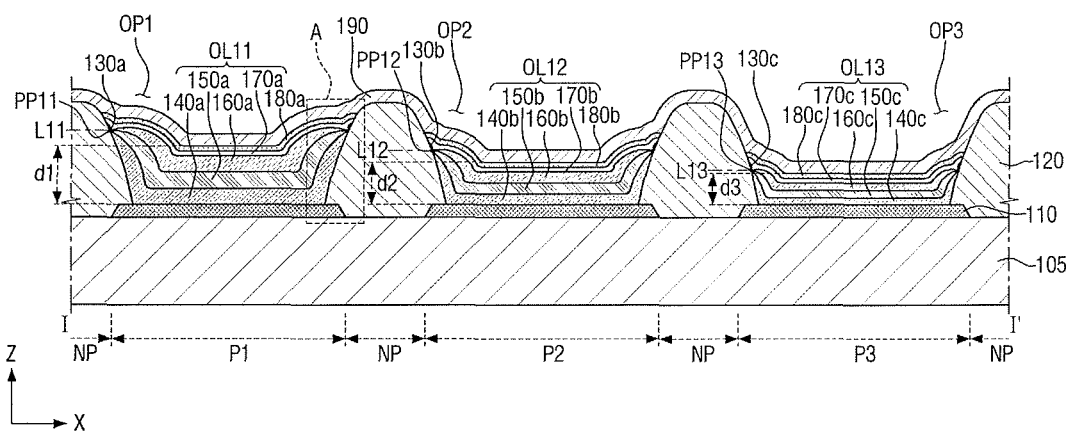
FIG. 2 illustrates a cross-sectional view taken along the line I-I' of FIG. 1.
Figure 3:
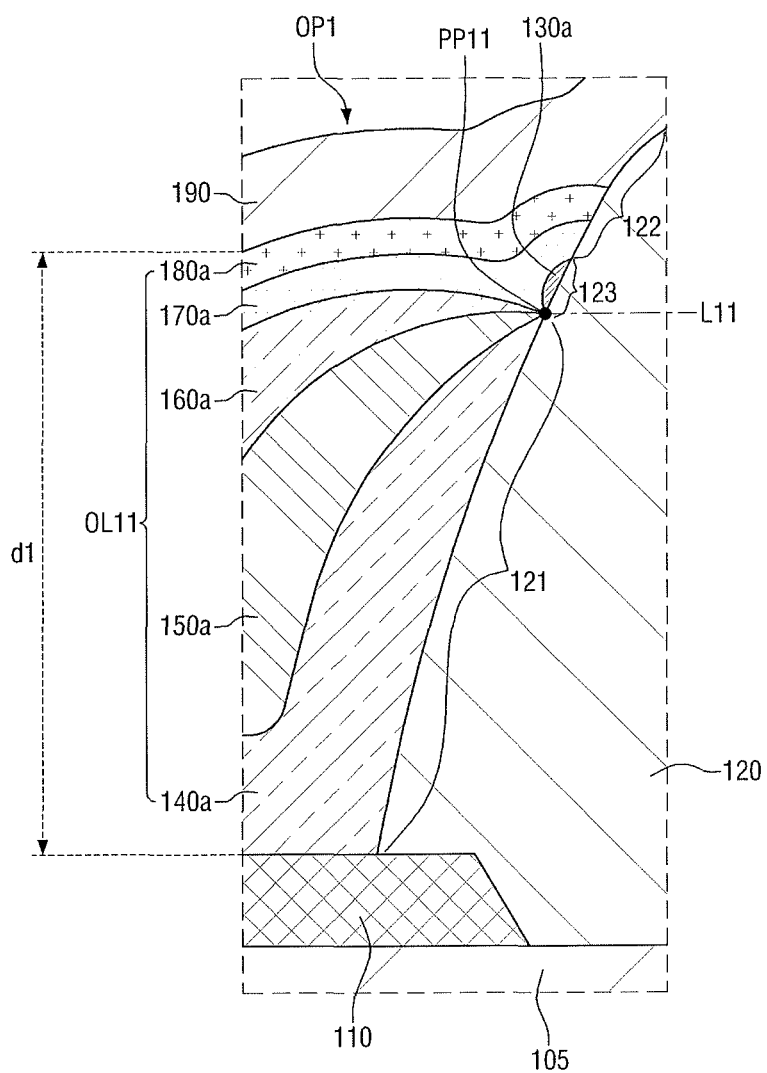
FIG. 3 illustrates an enlarged cross-sectional view of a portion 'A' of FIG. 2.
Figure 4:
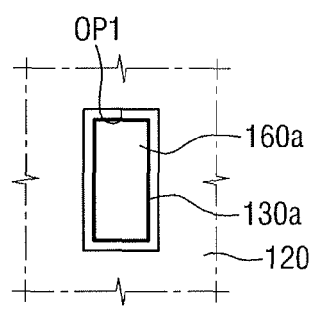
FIG. 4 illustrates a plan view of a first lyophobic pattern illustrated in FIG. 2.

FIG. 1 illustrates a schematic plan view of pixels P of a light-emitting display device 100 according to an embodiment. FIG. 2 illustrates a cross-sectional view taken along the line I-I' of FIG. 1. FIG. 3 illustrates an enlarged cross-sectional view of a portion 'A' of FIG. 2. FIG. 4 illustrates a plan view of a first lyophobic pattern 130a illustrated in FIG. 2.

Referring to FIGS. 1 through 4, the light-emitting display device 100 according to the current embodiment may include a substrate 105, a first electrode 110, a pixel defining layer 120, first through third lyophobic patterns 130a through 130c, first through third organic layers OL11 through OL13, and a second electrode 190. These elements may be stacked sequentially in a Z direction of FIG. 2.

The substrate 105 may include a display area DA and a non-display area NDA. A plurality of pixels P displaying images may be defined in the display area DA, and the non-display area NDA may be located outside the display area DA. The pixels P may be arranged in a matrix, for example, along a first direction X and a second direction Y intersecting the first direction X. The pixels P may include a first pixel P1, a second pixel P2, and a third pixel P3 arranged repeatedly and alternately along the first direction X. The first pixel P1 may be a red pixel which may emit red light, the second pixel P2 may be a green pixel which may emit green light, and the third pixel P3 may be a blue pixel which may emit blue light.

In FIG. 1, the pixels PX include the first through third pixels P1 through P3 which may emit, for example, light of three different colors. In an embodiment, the pixels P may include the first and second pixels P1 and P2 which may emit light of two different colors. In FIG. 1, for example, pixels P emitting light of the same color are arranged in a row along the second direction Y, and pixels PX emitting light of different colors are alternately arranged along the first direction X. A non-pixel NP may be defined between adjacent pixels P, for example, between the first and second pixels P1 and P2 and between the second and third pixels P2 and P3 as illustrated in FIG. 2.

The substrate 105 may include an insulating substrate. The insulating substrate may be made of a transparent glass material containing $SiO_2$ as its main component. In some embodiments, the insulating substrate may be made of an opaque material or a plastic material. Further, the insulating substrate may be a flexible substrate.

The substrate 105 may further include other structures formed on the insulating substrate. Examples of the structures may include wirings, electrodes, and insulating layers. In some embodiments, the substrate 105 may include a plurality of thin-film transistors (TFTs) formed on the insulating substrate. Each of at least some of the TFTs may have a drain electrode electrically connected to the first electrode 110. Each of the TFTs may include an active region made of amorphous silicon, polycrystalline silicon or monocrystalline silicon. In some embodiments, each of the TFTs may include an active region made of an oxide semiconductor.

The first electrode 110 may be formed on the substrate 105 in each pixel P. The first electrode 110 may be an anode which may provide holes to each of first through third light-emitting layers 160a through 160c of the first through third organic layers OL11 through OL13 in response to a signal transmitted to a corresponding TFT or a cathode which may provide electrons to each of the first through third light-emitting layers 160a through 160c of the first through third organic layers OL11 through OL13 in response to the signal transmitted to the TFT.

The first electrode 110 may be used as a transparent electrode, a reflective electrode, or a transflective electrode. To be used as a transparent electrode, the first electrode 110 may be formed of indium tin oxide (ITO), indium zinc oxide (IZO), zinc oxide (ZnO), or $In_2O_3$. To be used as a reflective electrode, the first electrode 110 may be formed by forming a reflective layer using Ag, Mg, Al, Pt, Pd, Au, Ni, Nd, Ir, Cr, or a compound of the same and then forming ITO, IZO, ZnO or $In_2O_3$ on the reflective layer. To be used as a transflective electrode, the first electrode 110 may be formed by forming a thin reflective layer using Ag, Mg, Al, Pt, Pd, Au, Ni, Nd, Ir, Cr, or a compound of the same and then forming ITO, IZO, ZnO or $In_2O_3$ on the thin reflective layer. The first electrode 110 may be formed by, for example, a photolithography method.

When the first electrode 110 is used as a transparent electrode, the light-emitting display device 100 may be a bottom emission light-emitting display device in which light generated by each of the first through third light-emitting layers 160a through 160c of the first through third organic layers OL11 through OL13 is emitted toward the first electrode 110. When the first electrode 110 is used as a reflective electrode, the light-emitting display device 100 may be a top emission light-emitting display device in which light generated by each of the first through third light-emitting layers 160a through 160c of the first through third organic layers OL11 through OL13 is emitted toward the second electrode 190. When the first electrode 110 is used as a transflective electrode, the light-emitting display device 100 may be a bottom emission light-emitting display device having a resonance structure, in which light generated by each of the first through third light-emitting layers 160a through 160c of the first through third organic layers OL11 through OL13 is emitted toward the first electrode 110.

In the light-emitting display device 100 formed as, for example, a bottom emission light-emitting display device, the resonance structure may be designed to reinforce light, which may fail to transmit through the first electrode 110 from among light generated by each of the first through third light-emitting layers 160a through 160c of the first through third organic layers OL11 through OL13, by reflecting the light again between the first electrode 110 and the second electrode 190 and emit the reinforced light. For the re-reflection of the light, a thickness of each of the first through third organic layers OL11 through OL13 may be adjusted so as to adjust an optical resonance distance between the first electrode 110 and the second electrode 190. The first electrode 110 may be used as a transflective electrode, and the second electrode 190 may be used as a reflective electrode. In the light-emitting display deice 100 formed as, for example, a top emission light-emitting display device having a resonance structure, the first electrode 110 may be used as a reflective electrode, and the second electrode 190 may be used as a transflective electrode.

The pixel defining layer 120 may be disposed on the substrate 105 to have first through third openings OP1 through OP3, each exposing the first electrode 110, and may define each pixel P on the substrate 105. In the first through third openings OP1 through OP3, the pixel defining layer 120 may have sloping side surfaces. The first opening OP1 may expose the first electrode 110 of the first pixel P1, the second opening OP2 may expose the first electrode 110 of the second pixel P2, and the third opening OP3 may expose the first electrode 110 of the third pixel P3.

The pixel defining layer 120 may allow each of the first through third organic layers OL11 through OL13 to be formed on the first electrode 110 through one of the first through third openings OP1 through OP3. The pixel defining layer 120 may be made of an insulating material. For example, the pixel defining layer 120 may be made of one or more organic materials selected from benzocyclobutene (BCB), polyimide (PI), polyamide (PA), acrylic resin, and phenolic resin. In an example, the pixel defining layer 120 may be made of an inorganic material such as silicon nitride.

In the first through third openings OP1 through OP3 of the pixel defining layer 120, the first through third lyophobic patterns 130a through 130c may be formed to small thicknesses in boundary parts between first parts of the side surfaces of the pixel defining layer 120 based on a height of the pixel defining layer 120 and second parts disposed on the first parts, respectively.

When at least one (e.g., the first through third light-emitting layers 160a through 160c) of elements of each of the first through third organic layers OL11 through OL13 is formed by an inkjet printing method, each of the first through third lyophobic patterns 130a through 130c may be made of an insulating material that is lyophobic to a light-emitting solution ejected into one of the first through third openings OP1 through OP3 of the pixel defining layer 120. For example, each of the first through third lyophobic patterns 130a through 130c may be made of an insulating material (such as an insulating material that contains fluorine) that may cause a contact angle of the light-emitting solution with the lyophobic pattern 130a, 130b or 130c to be approximately 40 degrees or more. To form the first through third lyophobic patterns 130a through 130c, a first solvent may be ejected into each of the first through third openings OP1 through OP3 of the pixel defining layer 120 using an inkjet printing method. Then, a second solvent mixed with a lyophobic insulating material may be ejected onto the first solvent. Finally, the second solvent and the first solvent may be dried sequentially, leaving the lyophobic insulating material. The remaining lyophobic insulating material may form each of the first through third lyophobic patterns 130a through 130c. The first solvent may be non-polar and may have a first boiling point and first density. Examples of the first solvent may include bezene, 1,4-dioxane, cyclopentane, and chloroform. The second solvent may be polar and may have a second boiling point lower than the first boiling point and second density lower than the first density. The second solvent may be, for example, tetrahydrofuran. The first solvent and the second solvent may not be mixed with each other.

The first through third lyophobic patterns 130a through 130c may cause first through third pinning points PP11 through PP13 defined between the first through third lyophobic patterns 130a through 130c and the first parts of the side surfaces of the pixel defining layer 120 to be formed at desired locations. Accordingly, when at least one (e.g., the first through third light-emitting layers 160a through 160c) of the elements of each of the first through third organic layers OL11 through OL13 is formed by an inkjet printing method, a light-emitting solution may be prevented from flowing out of each of the first through third openings OP1 through OP3 of the pixel defining layer 120. Each of the first through third light-emitting layers 160a through 160c formed by drying the light-emitting solution may be formed to a desired thickness under one of the first through third pinning points PP11 through PP13. The first through third light-emitting layers 160a through 160c may become thinner as the distances to the first through third lyophobic patterns 130a through 130c are reduced. Ends of the first through third light-emitting layers 160a through 160c may contact the first through third lyophobic patterns 130a through 130c, respectively.

The first lyophobic pattern 130a may be disposed in the first opening OP1 of the pixel defining layer 120, the second lyophobic pattern 130b may be disposed in the second opening OP2 of the pixel defining layer 120, and the third lyophobic pattern 130c may be disposed in the third opening OP3 of the pixel defining layer 120. In FIG. 3, the first lyophobic pattern 130a is formed to a small thickness in a boundary part 123 between a first part 121 of a side surface of the pixel defining layer 120 based on the height of the pixel defining layer 120 and a second part 122 disposed on the first part 121. Each of the second and third lyophobic patterns 130b and 130c may also be formed to a small thickness in a boundary part between a first part of a side surface of the pixel defining layer 120 based on the height of the pixel defining layer and a second part. The position of the boundary part 123 within the first opening OP1 of the pixel defining layer 120, the position of the boundary part within the second opening OP2, and the position of the boundary part within the third opening OP3 may be different. In the first opening OP of the pixel defining layer 120, the first part 121, the boundary part 123, and the second part 122 may be continuous. In each of the second and third openings OP2 and OP3 of the pixel defining layer 120, the first part, the boundary part and the second part may also be continuous.

In FIG. 4, the first lyophobic pattern 130a is formed as a ring pattern on a side surface of the pixel defining layer 120 in the first opening OP1 of the pixel defining layer 120. The second and third lyophobic patterns 130b and 130c may also be formed as ring patterns on side surfaces of the pixel defining layer 120 in the second and third openings OP2 and OP3 of the pixel defining layer 120, respectively.

The first through third lyophobic patterns 130a through 130c may be disposed at different locations based on, e.g., relative to, the height of the pixel defining layer 120. For example, assuming that the first pixel P1 is a red pixel, that the second pixel P2 is a green pixel, and that the third pixel P3 is a blue pixel, the first lyophobic pattern 130a may be disposed at a first location L11 on the side surface of the pixel defining layer 120, the second lyophobic pattern 130b may be disposed at a second location L12, which may be lower than the first location L11, on the side surface of the pixel defining layer 120, and the third lyophobic pattern 130c may be disposed at a third location L13, which may be lower than the second location L12, on the side surface of the pixel defining layer 120. In a red pixel that may emit red light having a long wavelength, an optical resonance distance d1 between the first electrode 110 and the second electrode 190 may be largest, and the first organic layer OL11 may be thickest. In a blue pixel that may emit blue light having a short wavelength, an optical resonance distance d3 between the first electrode 110 and the second electrode 190 may be smallest, and the third organic layer OL13 may be thinnest. In a green pixel that may emit green light having a wavelength between the wavelength of the red light and the wavelength of the blue light, a thickness of the second organic layer OL12 may be between the thickness of the first organic layer OL11 and the thickness of the third organic layer OL13 due to, for example, an optical resonance distance d2 between the optical resonance distance d1 and the optical resonance distance d3. Due to, for example, this resonance structure, the first through third lyophobic patterns 130a through 130c may be formed at different locations based on the height of the pixel defining layer 120. The wavelength of the red light may be approximately 650 nm, the wavelength of the green light may be approximately 550 nm, and the wavelength of the blue light may be approximately 430 nm.

In the light-emitting display device 100 having the resonance structure, the first light-emitting layer 160a, the second light-emitting layer 160b and the third light-emitting layer 160c having different thicknesses may be formed using an inkjet printing method in order to make the first organic layer OL11, the second organic layer OL12 and the third organic layer OL13 have different thicknesses. The first lyophobic pattern 130a, the second lyophobic pattern 130b and the third lyophobic pattern 130c may make it easy to adjust volumes of a first light-emitting solution 161 (see FIG. 22), a second light-emitting solution 162 (see FIG. 22) and a third light-emitting solution 163 (see FIG. 22) such that the first light-emitting solution 161, the second light-emitting solution 162 and the third light-emitting solution 163 may have the same surface shape based on the first pinning point PP11, the second pinning point PP12 and the third pinning point PP13 disposed at different locations. Volumes of the first light-emitting solution 161 (see FIG. 22), the second light-emitting solution 162 (see FIG. 22) and the third light-emitting solution 163 (see FIG. 22) may be different from each other. However, a ratio of a light-emitting material and a solvent in the first light-emitting solution 161 (see FIG. 22), a ratio of a light-emitting material and a solvent in the second light-emitting solution 162 (see FIG. 22), and a ratio of a light-emitting material and a solvent in the third light-emitting solution 163 (see FIG. 22) may be equal. If the first light-emitting solution 161 (see FIG. 22), the second light-emitting solution 162 (see FIG. 22) and the third light-emitting solution 163 (see FIG. 22)

having the same surface shape are dried in drying processes under the same conditions, the first light-emitting layer 160a, the second light-emitting layer 160b and the third light-emitting layer 160c having the same shape may be formed. Accordingly, emission uniformity in each pixel P may be improved.

If pinning points are formed at undesired locations in a light-emitting display device, it may be difficult to identify accurate locations of the pining points. For example, it may be difficult to control light-emitting solutions having different volumes to be ejected into openings of a pixel defining layer and to have the same surface shape based on the pinning points.

In the light-emitting display device 100 having the resonance structure, the first light-emitting layer 160a, the second light-emitting layer 160b and the third light-emitting layer 160c may be formed to have different thicknesses in order to make the first organic layer OL11, the second organic layer OL12 and the third organic layer OL13 have different thicknesses as described above. However, the thicknesses of the first through third light-emitting layers 160a through 160c, thicknesses of first through third hole injection layers 140a through 140c, and/or thicknesses of first through third hole transport layers 150a through 150c may also be made different in order to make the first through third organic layers OL11 through OL13 have different thicknesses.

Each of the first through third organic layers OL11 through OL13 may be formed on the first electrode 110 exposed through one of the first through third openings OP1 through OP3. The first organic layer OL11 may be disposed in the first opening OP1 of the pixel defining layer 120, the second organic layer OL12 may be disposed in the second opening OP2 of the pixel defining layer 120, and the third organic layer OL13 may be disposed in the third opening OP3 of the pixel defining layer 120.

The first organic layer OL11 may include the first hole injection layer 140a, the first hole transport layer 150a, the first light-emitting layer 160a, and a first electron transport layer 170a, and a first electron injection layer 180a.

The first hole injection layer 140a may be formed along the first electrode 110 and the side surface of the pixel defining layer 120 in the first opening OP1 of the pixel defining layer 120. The first hole injection layer 140a may be formed by ejecting a hole injection solution that contains a hole injection material into the first opening OP1 of the pixel defining layer 120 using an inkjet printing method. The first hole injection layer 140a may be disposed under the first lyophobic pattern 130a, for example, under the first pinning point PP11 and may become thinner from the first electrode 110 toward the side surface of the pixel defining layer 120.

The first hole injection layer 140a may be a buffer layer that may lower an energy barrier between the first electrode 110 and the first hole transport layer 150a. The hole injection layer 140a may facilitate the injection of holes from the first electrode 110 into the first hole transport layer 150a. The first hole injection layer 140a may be made of an organic compound such as, for example, 4,4',4"-tris(3-methylphenylphenylamino)triphenylamine (MTDATA), copper phthalocyanine (CuPc), or poly(3,4-ethylenedioxythiphene)/polystyrene sulfonate (PEDOT/PSS).

The first hole transport layer 150a may be disposed on the first hole injection layer 140a in the first opening OP1 of the pixel defining layer 120. The first hole transport layer 150a may be formed by ejecting a hole transport solution that contains a hole transport material into the first opening OP1 of the pixel defining layer 120 using an inkjet printing method. The first hole transport layer 150a may be disposed under the first lyophobic pattern 130a, for example, under the first pinning point PP11 and may become thinner from the first electrode 110 toward the side surface of the pixel defining layer 120.

The first hole transport layer 150a may transport holes received through the first hole injection layer 140a to the first light-emitting layer 160a. The first hole transport layer 150a may be made of a hole transport material having lower electrical conductivity than that of the first hole injection layer 140a. The first hole transport layer 150a may be made of an organic compound such as, for example, N,N'-diphenyl-N,N'-bis(3-methylphenyl)-1,1'-bi-phenyl-4,4'-diamine (TPD) or N,N'-di(naphthalen-1-yl)-N,N'-diphenyl-benzidine (NPB).

The first light-emitting layer 160a may be disposed on the first hole transport layer 150a in the first opening OP1 of the pixel defining layer 120. The first light-emitting layer 160a may be formed by ejecting a light-emitting solution that contains a light-emitting material into the first opening OP1 of the pixel defining layer 120 using an inkjet printing method. The first light-emitting layer 160a may be disposed under the first lyophobic pattern 130a, for example, under the first pinning point PP11 and may become thinner from the first electrode 110 toward the side surface of the pixel defining layer 120.

The first light-emitting layer 160a may emit light when holes received from the first electrode 110 and electrons received from the second electrode 190 recombine. For example, holes and electrons provided to the first light-emitting layer 160a may combine to form excitons. The excitons may change from an excited state to a ground state, and the first light-emitting layer 160a may emit light. The first light-emitting layer 160a may be, for example, a red light-emitting layer which may emit red light.

The red light-emitting layer may include one red light-emitting material or a host and a red dopant. Examples of the host of the red light-emitting layer may include, for example, tris(8-quinolinorate)aluminum ($Alq_3$), 4,4'-N,N'-dicarbazol-biphenyl (CBP), ploy(n-vinylcarbazole) (PVK), 9,10-Di(naphthyl-2-yl)anthrace (ADN), 4,4',4"-tris(N-carbazolyl)triphenylamine (TCTA), 1,3,5-tris(N-phenylbenzimidazol-2-yl)benzene (TPBI), 3-tert-butyl-9,10-di(naphth-2-yl)anthracene (TBADN), ter-fluorene (E3), and distyrylarylene (DSA). Examples of the red dopant may include, for example, PtOEP, $Ir(piq)_3$, and $Btp_2Ir(acac)$.

The first electron transport layer 170a may be disposed on the first light-emitting layer 160a. The first electron transport layer 170a may transport electrons received from the second electrode 190 via the first electron injection layer 180a to the first light-emitting layer 160a. The first electron transport layer 170a may be made of an organic compound such as, for example, 4,7-diphenyl-1,10-phenanthroline) (Bphen), aluminum(III)bis(2-methyl-8-hydroxyquinolinato)4-phenylphenolate (BAlq), tris(8-quinolinorate)aluminum ($Alq_3$), berylliumbis(benzoquinolin-10-olate) ($Bebq_2$), or (1,3,5-tris(N-phenylbenzimidazole-2-yl)benzene) TPBI. The first electron transport layer 170a may be formed by, for example, a deposition method.

The first electron injection layer 180a may be disposed on the first electron transport layer 170a. The first electron injection layer 180a may be a buffer layer that may lower an energy barrier between the first electron transport layer 170a and the second electrode 190. The first electron injection layer 180a may facilitate the injection of electrons from the second electrode 190 into the first electron transport layer 170a. The first electron injection layer 180a may be made of, for example, LiF or CsF. The first electron injection layer 180*a* may be formed by, for example, a deposition method.

The second organic layer OL12 may include the second hole injection layer 140*b*, the second hole transport layer 150*b*, the second light-emitting layer 160*b*, a second electron transport layer 170*b*, and a second electron injection layer 180*b*.

The second hole injection layer 140*b* may be similar to the first hole injection layer 140*a*. However, the second hole injection layer 140*b* may be disposed on the first electrode 110 and a side surface of the pixel defining layer 120 under the second lyophobic pattern 130*b*, for example, under the second pinning point PP12 in the second opening OP2 of the pixel defining layer 120. A thickness of the second hole injection layer 140*b* may be different from that of the first hole injection layer 140*a*. For example, the thickness of the second hole injection layer 140*b* may be smaller than that of the first hole injection layer 140*a*. This thickness comparison may be made in parts where the elements of the first and second organic layers OL11 and OL12 are all flat, and the same may apply to the following description.

The second hole transport layer 150*b* may be similar to the first hole transport layer 150*a*. The second hole transport layer 150*b* may be disposed on the second hole injection layer 140*b* under the second lyophobic pattern 130*b*, for example, under the second pinning point PP12 in the second opening OP2 of the pixel defining layer 120. A thickness of the second hole transport layer 150*b* may be different from that of the first hole transport layer 150*a*. For example, the thickness of the second hole transport layer 150*b* may be smaller than that of the first hole transport layer 150*a*.

The second light-emitting layer 160*b* may be similar to the first light-emitting layer 160*a*. However, the second light-emitting layer 160*b* may be disposed on the second hole transport layer 150*b* under the second lyophobic pattern 130*b*, for example, under the second pinning point PP12 in the second opening OP2 of the pixel defining layer 120. The second light-emitting layer 160*b* may be made of a material that may emit light of a color different from the color of light emitted from the first light-emitting layer 160*a*. The second light-emitting layer 160*b* may be, for example, a green light-emitting layer which may emit green light. The green light-emitting layer may include one green light-emitting material or a host and a green dopant. The host of the red light-emitting layer may be used as the host of the green light-emitting layer. Examples of the green dopant may include, for example, Ir(ppy)$_3$, Ir(ppy)$_2$(acac), and Ir(mpyp)$_3$. A thickness of the second light-emitting layer 160*b* may be different from that of the first light-emitting layer 160*a*. For example, the thickness of the second light-emitting layer 160*b* may be smaller than that of the first light-emitting layer 160*a*.

The second electron transport layer 170*b* may be similar to the first electron transport layer 170*a*. However, the second electron transport layer 170*b* may be disposed on the second light-emitting layer 160*b*.

The second electron injection layer 180*b* may be similar to the first electron injection layer 180*a*. However, the second electron injection layer 180*b* may be disposed on the second electron transport layer 170*b*.

The third organic layer OL13 may include the third hole injection layer 140*c*, the third hole transport layer 150*c*, the third light-emitting layer 160*c*, a third electron transport layer 170*c*, and a third electron injection layer 180*c*.

The third hole injection layer 140*c* may be similar to the second hole injection layer 140*b*. However, the third hole injection layer 140*c* may be disposed on the first electrode 110 and a side surface of the pixel defining layer 120 under the third lyophobic pattern 130*c*, for example, under the third pinning point PP13 in the third opening OP3 of the pixel defining layer 120. A thickness of the third hole injection layer 140*c* may be different from that of the second hole injection layer 140*b*. For example, the thickness of the third hole injection layer 140*c* may be smaller than that of the second hole injection layer 140*b*.

The third hole transport layer 150*c* may be similar to the second hole transport layer 150*b*. However, the third hole transport layer 150*c* may be disposed on the third hole injection layer 140*c* under the third lyophobic pattern 130*c*, for example, under the third pinning point PP13 in the third opening OP3 of the pixel defining layer 120. A thickness of the third hole transport layer 150*c* may be different from that of the second hole transport layer 150*b*. For example, the thickness of the third hole transport layer 150*c* may be smaller than that of the second hole transport layer 150*b*.

The third light-emitting layer 160*c* may be similar to the second light-emitting layer 160*b*. However, the third light-emitting layer 160*c* may be disposed on the third hole transport layer 150*c* under the third lyophobic pattern 130*c*, for example, under the third pinning point PP13 in the third opening OP3 of the pixel defining layer 120. The third light-emitting layer 160*c* may be made of a material that may emit light of a color different from the color of light emitted from the second light-emitting layer 160*b*. The third light-emitting layer 160*c* may be, for example, a blue light-emitting layer which may emit blue light. The blue light-emitting layer may include one blue light-emitting material or a host and a blue dopant. The host of the red light-emitting layer may be used as the host of the blue light-emitting layer. Examples of the blue dopant may include, for example, F$_2$Irpic, (F$_2$ppy)$_2$Ir(tmd), Ir(dfppz)$_3$, ter-fluorene, 4,4'-bis(4-diphenylaminostyryl) biphenyl (DPAVBi), and 2,5,8,11-tetra-ti-butyl pherylene (TBPe). A thickness of the third light-emitting layer 160*c* may be different from that of the second light-emitting layer 160*b*. For example, the thickness of the third light-emitting layer 160*c* may be smaller than that of the second light-emitting layer 160*b*.

The third electron transport layer 170*c* may be similar to the second electron transport layer 170*b*. However, the third electron transport layer 170*c* may be disposed on the third light-emitting layer 160*c*.

The third electron injection layer 180*c* may be similar to the second electron injection layer 180*b*. However, the third electron injection layer 180*c* may be disposed on the third electron transport layer 170*c*.

The second electrode 190 may be disposed on the first through third organic layers OL11 through OL13 and may be a cathode providing electrons to the first through third light-emitting layers 160*a* through 160*c* or an anode providing holes to the first through third light-emitting layers 160*a* through 160*c*. Like the first electrode 110, the second electrode 190 may be used as a transparent electrode, a reflective electrode or a transflective electrode. When the second electrode 190 is used as a transparent electrode, the light-emitting display device 100 may be a top emission light-emitting display device in which light generated by each of the first through third light-emitting layers 160*a* through 160*c* of the first through third organic layers OL11 through OL13 is emitted toward the second electrode 190. When the second electrode 190 is used as a reflective electrode, the light-emitting display device 100 may be a bottom emission light-emitting display device in which light generated by each of the first through third light-emitting layers 160a through 160c of the first through third organic layers OL11 through OL13 is emitted toward the first electrode 110. When the second electrode 190 is used as a transflective electrode, the light-emitting display device 100 may be a bottom emission light-emitting display device having a resonance structure, in which light generated by each of the first through third light-emitting layers 160a through 160c of the first through third organic layers OL11 through OL13 is emitted toward the second electrode 190. The second electrode 190 may be formed by, for example, a deposition method.

The light-emitting display device 100 may further include an encapsulation substrate placed on the second electrode 190. The encapsulation substrate may be made of an insulating substrate. A spacer may be disposed between the second electrode 190 on the pixel defining layer 120 and the encapsulation substrate. In some embodiments, the encapsulation substrate may be omitted. An encapsulation layer made of an insulating material may cover and protect the entire structure.

As described above, the light-emitting display device 100 according to the current embodiment may include the first through third lyophobic patterns 130a through 130c disposed at predetermined heights on the side surfaces of the pixel defining layer 120 in the first through third openings OP1 through OP3 of the pixel defining layer 120, respectively. Therefore, the first through third pinning points PP11 through PP13 may be formed at desired locations. When at least one of the elements of each of the first through third organic layers OL11 through OL13, for example, the first through third light-emitting layers 160a through 160c are formed using an inkjet printing method, the first through third pinning points PP11 through PP13 may prevent light-emitting solutions from flowing out of the first through third openings OP1 through OP3 of the pixel defining layer 120 and fix the locations of the first through third light-emitting layers 160a through 160c formed by drying the light-emitting solutions.

Therefore, the light-emitting display device 100 according to the current embodiment may have improved display quality because the first through third light-emitting layers 160a through 160c having desired thicknesses may be formed at desired locations using the first through third pinning points PP11 through PP13. A manufacturing process may be simpler than when a pinning point is formed by forming a lyophilic pixel defining layer and a lyophobic pixel defining layer through two photolithography processes. Furthermore, it may be possible to reduce a reduction in the characteristics and life of a light-emitting layer of an organic layer due to, for example, the diffusion of fluorine in a light-emitting display device having a pixel defining layer, the whole of which is lyophobic.

The light-emitting display device 100 according to the current embodiment may include the first through third light-emitting patterns 130a through 130c formed at different desired locations in the first through third openings OP1 through OP3 of the pixel defining layer 120, and the first through third pinning points PP11 through PP13 may be formed at different desired locations in the first through third openings OP1 through OP3 of the pixel defining layer 120.

Accordingly, when the first through third light-emitting layers 160a through 160c having different thicknesses are formed using an inkjet printing method in order to apply a resonance structure to the light-emitting display device 100 according to the current embodiment, for example, in order to form the first through third organic layers OL11 through OL13 having different thicknesses in the first through third openings OP1 through OP3 of the pixel defining layer 120, the volumes of the light-emitting solutions 161 through 163 (see FIG. 21) may be easily adjusted to make the first through third light-emitting solutions 161 through 163 have the same surface shape based on the first through third pinning points PP11 through PP13 disposed at different locations.

Therefore, the first through third light-emitting layers 160a through 160c having the same shape may be formed by drying the light-emitting solutions 161 through 163 (see FIG. 22) having the same surface shape in drying processes under the same conditions, and the light-emitting display device 100 according to the current embodiment may have improved emission uniformity in each pixel P.

Figure 5:
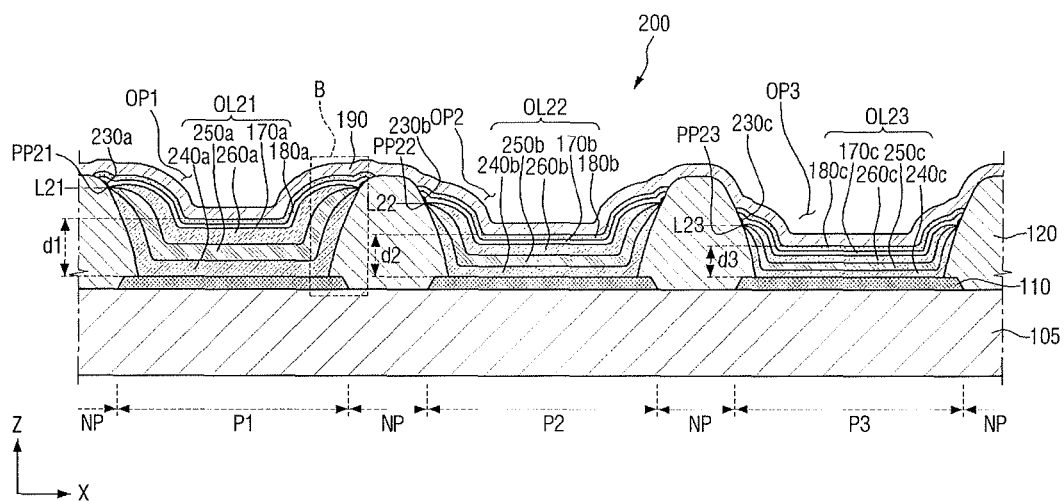
FIG. 5 illustrates a schematic plan view of a light-emitting display device according to an embodiment.
Figure 6:
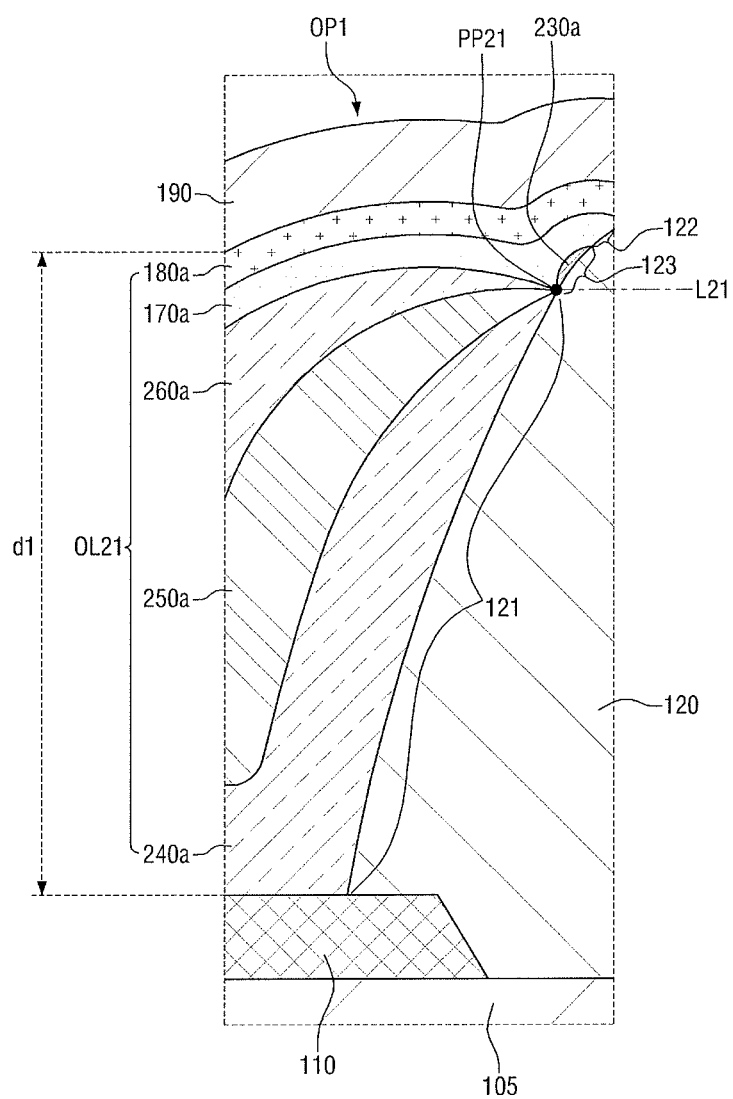
FIG. 6 illustrates an enlarged cross-sectional view of a portion 'B' of FIG. 5.

FIG. 5 illustrates a schematic plan view of a light-emitting display device 200 according to an embodiment. FIG. 6 illustrates an enlarged cross-sectional view of a portion 'B' of FIG. 5.

Referring to FIGS. 5 and 6, the light-emitting display device 200 according to the current embodiment may be the same as the light-emitting display device 100 of FIG. 2 except for first through third lyophobic patterns 230a through 230c and first through third organic layers OL21 through OL23. Accordingly, the light-emitting display device 200 according to the current embodiment will be described, focusing mainly on the first through third lyophobic patterns 230a through 230c and the first through third organic layers OL21 through OL23.

The light-emitting display device 200 according to the current embodiment may include a substrate 105, a first electrode 110, a pixel defining layer 120, the first through third lyophobic patterns 230a through 230c, the first through third organic layers OL21 through OL23, and a second electrode 190. These elements may be stacked sequentially in a Z direction of FIG. 5.

The first lyophobic pattern 230a may be disposed in a first opening OP1 of the pixel defining layer 120, the second lyophobic pattern 230b may be disposed in a second opening OP2 of the pixel defining layer 120, and the third lyophobic pattern 230c may be disposed in a third opening OP3 of the pixel defining layer 120. The first through third lyophobic patterns 230a through 230c may be similar to the first through third lyophobic patterns 130a through 130c of FIG. 2.

However, first through third locations L21 through L23 at which the first through third lyophobic patterns 230a through 230c may be formed on side surfaces of the pixel defining layer 120 based on a height of the pixel defining layer 120 in the first through third openings OP1 through OP3 of the pixel defining layer 120 may be higher than the first through third locations L11 through L13 of the first through third lyophobic patterns 130a through 130c of FIG. 2.

The first through third lyophobic patterns 230a through 230c may cause first through third pinning points PP21 through PP23 to be formed at higher locations on the side surfaces of the pixel defining layer 120 than the first through third pinning points PP11 through PP13 of FIG. 2, and the first through third pinning points PP21 through PP23 may be located further outwards in the first direction X and the second direction Y of FIG. 1 than the first through third pinning points PP11 through PP13 of FIG. 2.

Therefore, the first through third lyophobic patterns 230a through 230c may cause at least one of elements of each of the first through third organic layers OL21 through OL23, for example, first through third light-emitting layers 260a through 260c to be formed wider in the first direction X and the second direction Y of FIG. 1 in the first through third openings OP1 through OP3 of the pixel defining layer 120. The first through third lyophobic patterns 230a through 230c may cause the first through third light-emitting layers 260a through 260c to have wider uniform-thickness portions, and emission uniformity and emission efficiency in each pixel P may be improved.

The first organic layer OL21 may be disposed in the first opening OP1 of the pixel defining layer 120 and include a first hole injection layer 240a, a first hole transport layer 250a, the first light-emitting layer 260a, a first electron transport layer 170a, and a first electron injection layer 180a. The second organic layer OL22 may be disposed in the second opening OP2 of the pixel defining layer 120 and include a second hole injection layer 240b, a second hole transport layer 250b, the second light-emitting layer 260b, a second electron transport layer 170b, and a second electron injection layer 180b. The third organic layer OL23 may be disposed in the third opening OP3 of the pixel defining layer 120 and include a third hole injection layer 240c, a third hole transport layer 250c, the third light-emitting layer 260c, a third electron transport layer 170c, and a third electron injection layer 180c. The first through third organic layers OL21 through OL23 may be similar to the first through third organic layers OL11 through OL13 of FIG. 2.

However, the first through third organic layers OL21 through OL23 may include the first through third light-emitting layers 260a through 260c which may be wider in the first direction X and the second direction Y of FIG. 1 and may have wider uniform-thickness portions due to, for example, the first pinning points PP21 through PP23 formed by the first through third lyophobic patterns 230a through 230c.

As described above, the light-emitting display device 200 according to the current embodiment may include the first through third lyophobic patterns 230a through 230c formed at high locations on the side surfaces of the pixel defining layer 120 based on the height of the pixel defining layer 120 in the first through third openings OP1 through OP3 of the pixel defining layer 120. Therefore, the first through third pinning points PP21 through PP23 may be formed at locations further outwards in the first direction X and the second direction Y of FIG. 1.

In the light-emitting display device 200 according to the current embodiment, at least one of the elements of each of the first through third organic layers OL21 through OL23, for example, the first through third light-emitting layers 260a through 260c may be formed under the first through third pinning points PP11 through PP13 to have the same shape, to be wider in the first direction X and the second direction Y of FIG. 1, and to have wider uniform-thickness portions. Consequently, emission uniformity and emission efficiency in each pixel P may be improved.

Figure 7:
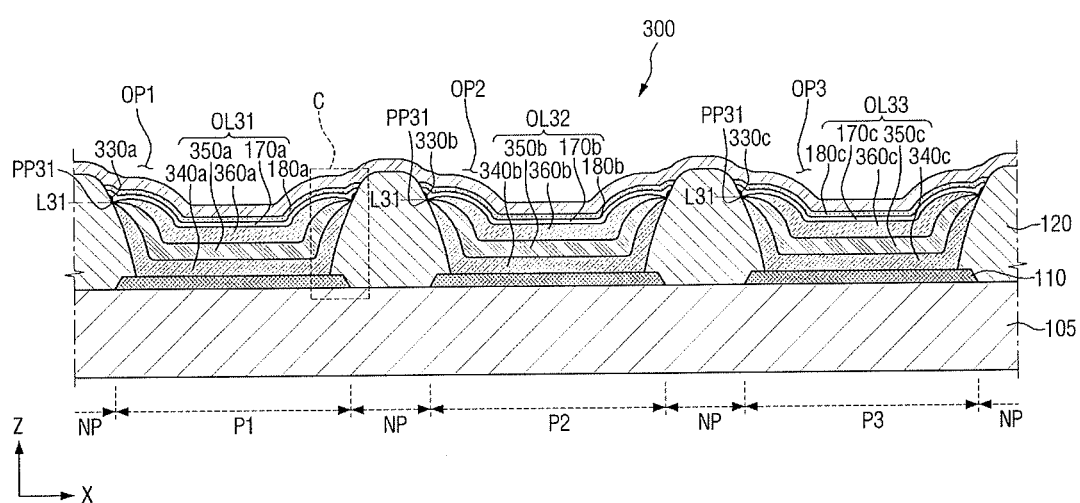
FIG. 7 illustrates a schematic plan view of a light-emitting display device according to an embodiment.
Figure 8:
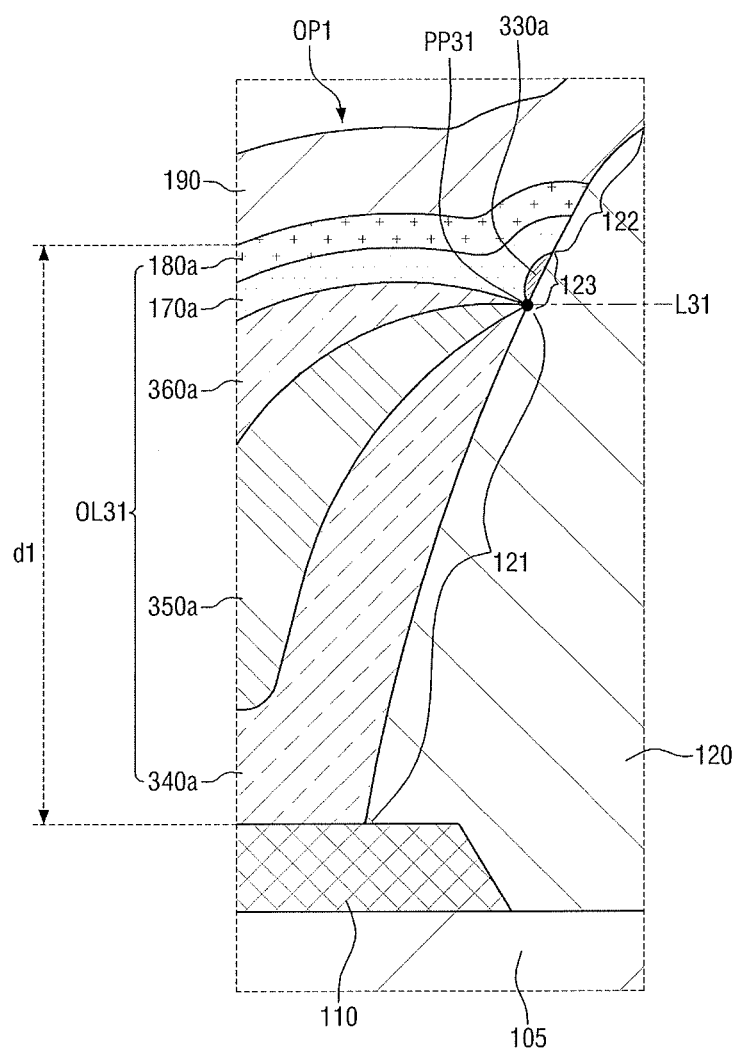
FIG. 8 illustrates an enlarged cross-sectional view of a portion 'C' of FIG. 7.

FIG. 7 illustrates a schematic plan view of a light-emitting display device 300 according to an embodiment. FIG. 8 illustrates an enlarged cross-sectional view of a portion 'C' of FIG. 7.

Referring to FIGS. 7 and 8, the light-emitting display device 300 according to the current embodiment may be the same as the light-emitting display device 100 of FIG. 2 except for first through third lyophobic patterns 330a through 330c and first through third organic layers OL31 through OL33. Accordingly, the light-emitting display device 300 according to the current embodiment will be described, focusing mainly on the first through third lyophobic patterns 330a through 330c and the first through third organic layers OL31 through OL33.

The light-emitting display device 300 according to the current embodiment may include a substrate 105, a first electrode 110, a pixel defining layer 120, the first through third lyophobic patterns 330a through 330c, the first through third organic layers OL31 through OL33, and a second electrode 190. These elements may be stacked sequentially in a Z direction of FIG. 7.

The first lyophobic pattern 330a may be disposed in a first opening OP1 of the pixel defining layer 120, the second lyophobic pattern 330b may be disposed in a second opening OP2 of the pixel defining layer 120, and the third lyophobic pattern 330c may be disposed in a third opening OP3 of the pixel defining layer 120. The first through third lyophobic patterns 330a through 330c may be similar to the first through third lyophobic patterns 130a through 130c of FIG. 2.

However, the first through third lyophobic patterns 330a through 330c may be formed at the same location L31. Therefore, the location of a pinning point PP31 in the first opening OP1, the location of a pinning point PP31 in the second opening OP2, and the location of a pinning point PP31 in the third opening OP3 may be the same. This is because the light-emitting display device 300 may have a non-resonance structure in which the first through third organic layers OL31 through OL33 may have the same thickness. To form the first through third lyophobic patterns 330a through 330c, a first solvent may be ejected into each of the first through third openings OP1 through OP3 of the pixel defining layer 120 using a spin coating method or a slit coating method. Then, a second solvent mixed with a lyophobic insulating material may be ejected onto the first solvent using an inkjet printing method. Finally, the second solvent and the first solvent may be sequentially dried. The lyophobic insulating material remaining after the drying of the second solvent and the first solvent may form the first through third lyophobic patterns 330a through 330c. Types of the first solvent, the lyophobic insulating material and the second solvent used to form the first through third lyophobic patterns 330a through 330c may be the same as those of the first solvent, the lyophobic insulating material and the second solvent used to form the first through third lyophobic patterns 130a through 130c of FIG. 2.

The first organic layer OL31 may be disposed in the first opening OP1 of the pixel defining layer 120 and include a first hole injection layer 340a, a first hole transport layer 350a, a first light-emitting layer 360a, a first electron transport layer 170a, and a first electron injection layer 180a. The second organic layer OL32 may be disposed in the second opening OP2 of the pixel defining layer 120 and include a second hole injection layer 340b, a second hole transport layer 350b, a second light-emitting layer 360b, a second electron transport layer 170b, and a second electron injection layer 180b. The third organic layer OL33 may be disposed in the third opening OP3 of the pixel defining layer 120 and include a third hole injection layer 340c, a third hole transport layer 350c, a third light-emitting layer 360c, a third electron transport layer 170c, and a third electron injection layer 180c. The first through third organic layers OL31 through OL33 may be similar to the first through third organic layers OL11 through OL13 of FIG. 2.

However, elements of the first organic layer OL31, elements of the second organic layer OL32, and elements of the third organic layer OL33 may have the same thickness.

As described above, the light-emitting display device 300 according to the current embodiment may include the first through third lyophobic patterns 330a through 330c formed at the same location L31 on side surfaces of the pixel defining layer 120 based on a height of the pixel defining layer 120 in the first through third openings OP1 through OP3 of the pixel defining layer 120. Accordingly, the pinning points PP31 may be formed at the same location in the first through third openings OP1 through OP3 of the pixel defining layer 120.

Therefore, in the light-emitting display device 300 having a non-resonance structure according to the current embodiment, the first through third light-emitting layers 360a through 360c having the same thickness may be formed at the same location based on the pinning points PP31, and display quality of the light-emitting display device 300 according to the current embodiment may be improved. A manufacturing process may be simpler than when a pinning point is formed by forming a lyophilic pixel defining layer and a lyophobic pixel defining layer through two photolithography processes. Furthermore, it may be possible to reduce a reduction in the characteristics and life of a light-emitting layer of an organic layer due to, for example, the diffusion of fluorine in a light-emitting display device having a pixel defining layer, the whole of which is lyophobic.

In the non-resonance structure of the light-emitting display device 300 according to the current embodiment in which the first through third organic layers OL31 through OL33 may have the same thickness due to, for example, the pinning points PP31 formed at the same location in the first through third openings OP1 through OP3 of the pixel defining layer 120, when at least one of the elements of each of the first through third organic layers OL31 through OL33, for example, the first through third light-emitting layers 360a through 360c are formed using an inkjet printing method, volumes of light-emitting solutions (the volumes of the light-emitting solutions are the same in the non-resonance structure) may be easily adjusted to make the light-emitting solutions have the same surface shape based on the pinning points PP31 formed at the same location.

Therefore, the first through third light-emitting layers 360a through 360c having the same shape may be formed by drying the light-emitting solutions having the same surface shape in drying processes under the same conditions, and the light-emitting display device 300 having the non-resonance structure according to the current embodiment may have improved emission uniformity in each pixel P.

Hereinafter, an example method of manufacturing the light-emitting display devices 100 through 300 according to the above-described embodiments will be described.

FIGS. 9 through 24 illustrate cross-sectional views of a method of manufacturing a light-emitting display device according to an embodiment.

Figure 9:
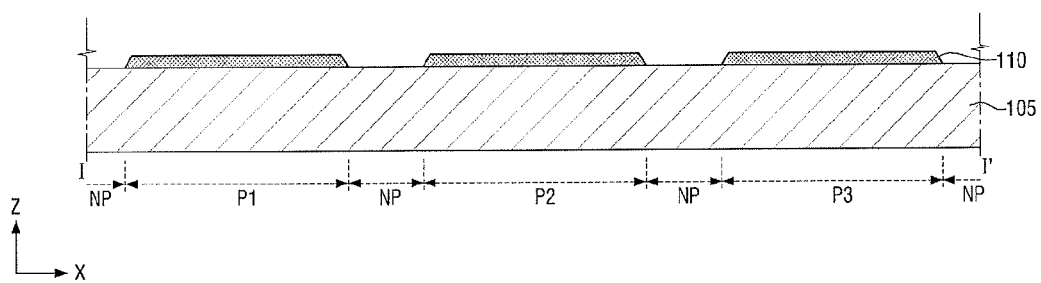
FIGS. 9 through 24 illustrate cross-sectional views of a method of manufacturing a light-emitting display device according to an embodiment.

Referring to FIG. 9, a first electrode 110 may be formed on a substrate 105 including a plurality of pixels P (see FIG. 1) in each pixel P (see FIG. 1). The first electrode 110 may be formed by depositing and patterning at least one of a transparent electrode material, a reflective electrode material and a transflective electrode material on the substrate 105. The pixels P (see FIG. 1) may include a first pixel P1, a second pixel P2, and a third pixel P3. The first pixel P1 may be, for example, a red pixel which may emit red light, the second pixel P2 may be, for example, a green pixel which may emit green light, and the third pixel P3 may be, for example, a blue pixel which may emit blue light.

Figure 10:
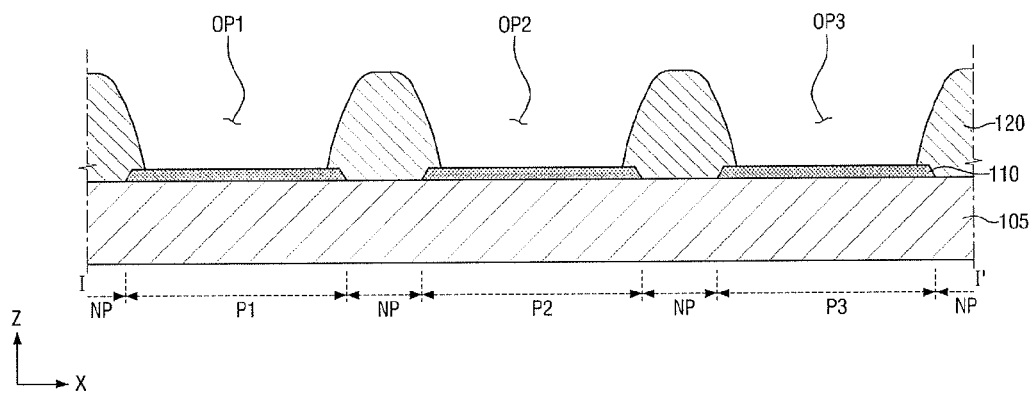

Referring to FIG. 10, a pixel defining layer 120 may be formed on the substrate 105 to define each of the first through third pixels P1 through P3 and may have first through third openings OP1 through OP3, each exposing the first electrode 110. The pixel defining layer 120 may be formed by depositing an insulating material on the whole surface of the substrate 105 to cover the first electrodes 110 using a deposition method and patterning the deposited insulating material. The first opening OP1 may expose the first electrode 110 of the first pixel P1, the second opening OP2 may expose the first electrode 110 of the second pixel P2, and the third opening OP3 may expose the first electrode 110 of the third pixel P3.

Referring to FIGS. 11 through 14, in the first through third openings OP1 through OP3 of the pixel defining layer 120, first through third lyophobic patterns 130a through 130c may be formed to have small thicknesses in boundary parts between first parts of side surfaces of the pixel defining layer 120 based on a height of the pixel defining layer 120 and second parts disposed on the first parts, respectively. The first lyophobic pattern 130a may be disposed in the first opening OP1 of the pixel defining layer 120, the second lyophobic pattern 130 may be disposed in the second opening OP2 of the pixel defining layer 120, and the third lyophobic pattern 130c may be disposed in the third opening OP3 of the pixel defining layer 120.

Figure 11:
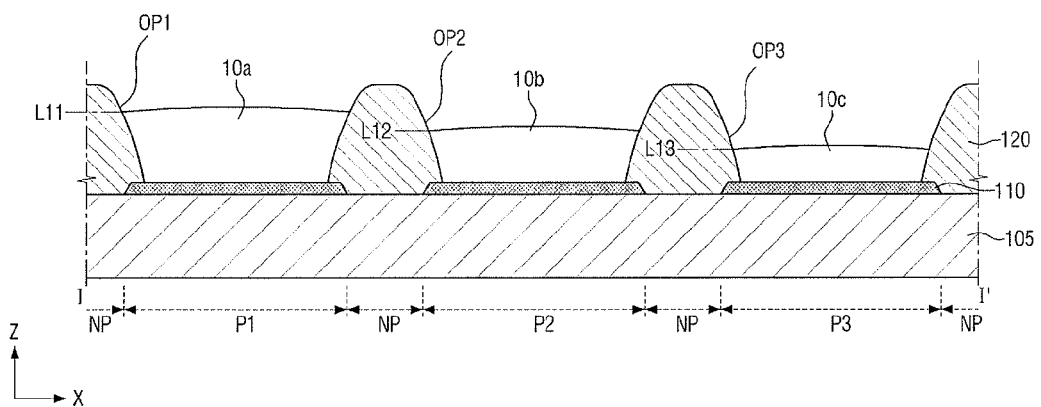

Referring to FIG. 11, the first through third openings OP1 through OP3 of the pixel defining layer 120 may be filled with first solvents 10a through 10c up to first through third locations L11 through L13 on the side surfaces of the pixel defining layer 120 based on the height of the pixel defining layer 120, respectively. The first solvents 10a through 10c may respectively be ejected into the first through third openings OP1 through OP3 of the pixel defining layer 120 using an inkjet printing method. The first solvents 10a through 10c may be different in volume but may have the same type. The first solvents 10a through 10c may be non-polar and may have a first boiling point and first density. For example, the first solvents 10a through 10c may be bezene, 1,4-dioxane, cyclopentane, or chloroform.

Figure 12:
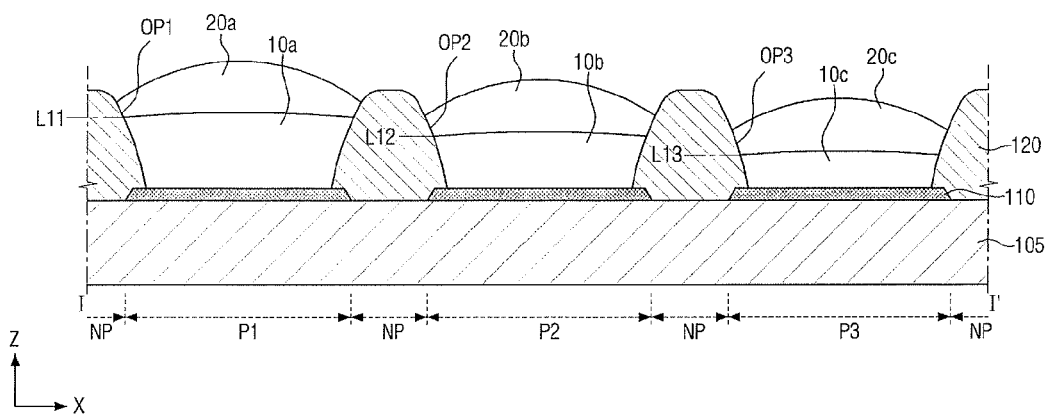

Referring to FIG. 12, second solvents 20a through 20c mixed with a lyophobic insulating material may respectively be ejected onto the first solvents 10a through 10c in the first through third openings OP1 through OP3 of the pixel defining layer 120 using an inkjet printing method. The second solvents 20a through 20c may have the same volume and type. The second solvents 20a through 20c may be polar and may have a second boiling point lower than the first boiling point and second density lower than the first density. For example, the second solvents 20a through 20c may be tetrahydrofuran. The lyophobic insulating material may be an insulating material (e.g., an insulating material that contains fluorine) that may cause a contact angle of a light-emitting solution with each of the first through third lyophobic patterns 130a through 130c to be approximately 40 degrees or more.

Figure 13:
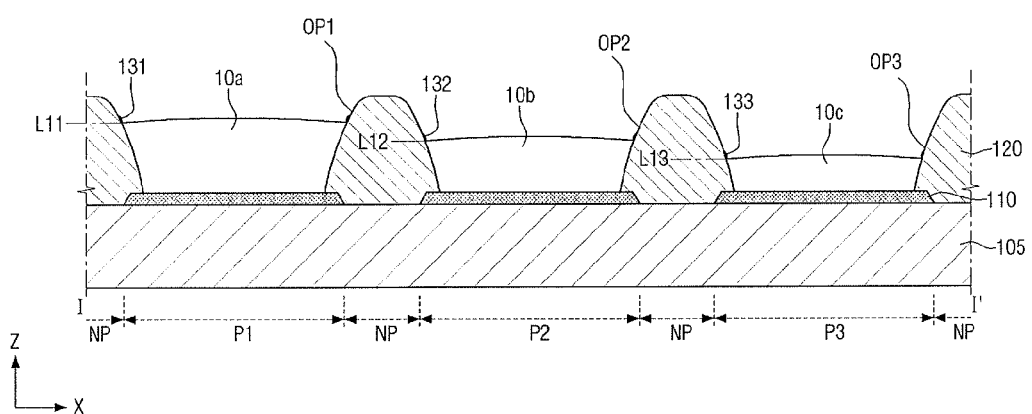

Referring to FIG. 13, the second solvents 20a through 20c may be dried. Then, the lyophobic insulating material contained in the second solvents 20a through 20c may agglomerate at the first through third locations L11 through L13 on the sides surfaces of the pixel defining layer 120 due to, for example, a coffee ring effect.

Figure 14:
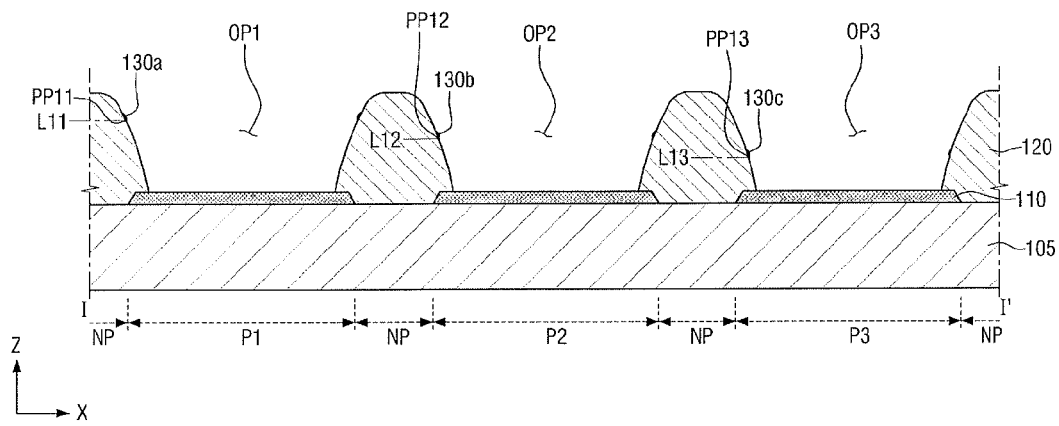

Referring to FIG. 14, the first solvents 10a through 10c may be dried. Then, the first through third lyophobic patterns 130a through 130c may be formed of the lyophobic insulating material at the first through third locations L11 through L13 on the side surfaces of the pixel defining layer 120, respectively. The first through third lyophobic patterns 130a through 130c may cause first through third pinning points PP11 through PP13 to be formed in the first through third openings OP1 through OP3 of the pixel defining layer 120, respectively.

Figure 15:
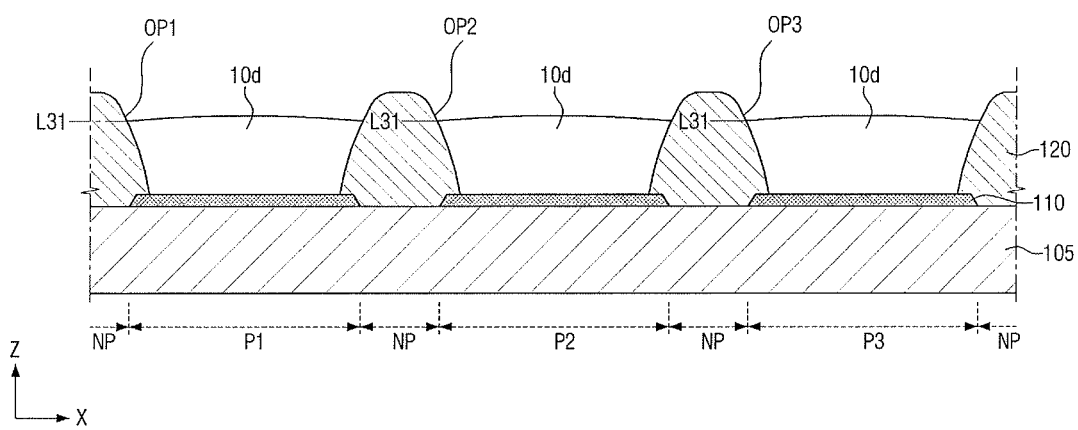
Figure 16:
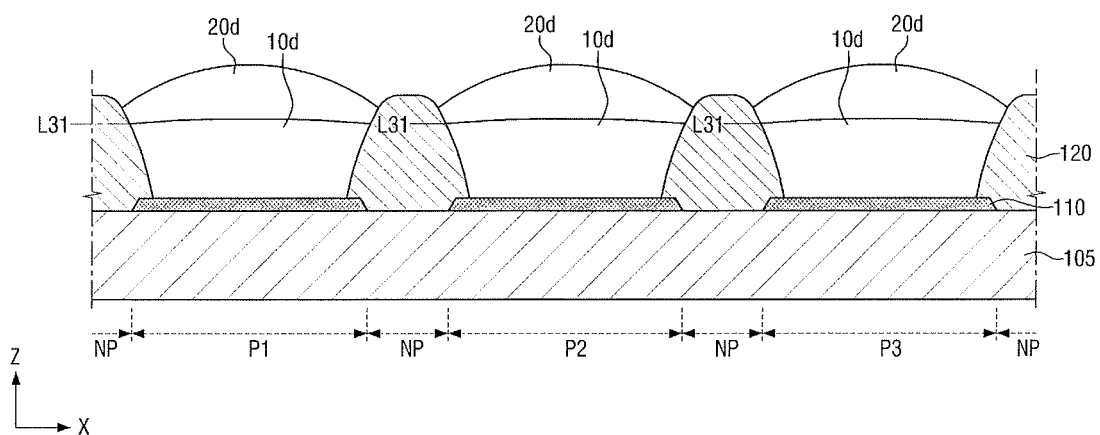
Figure 17:
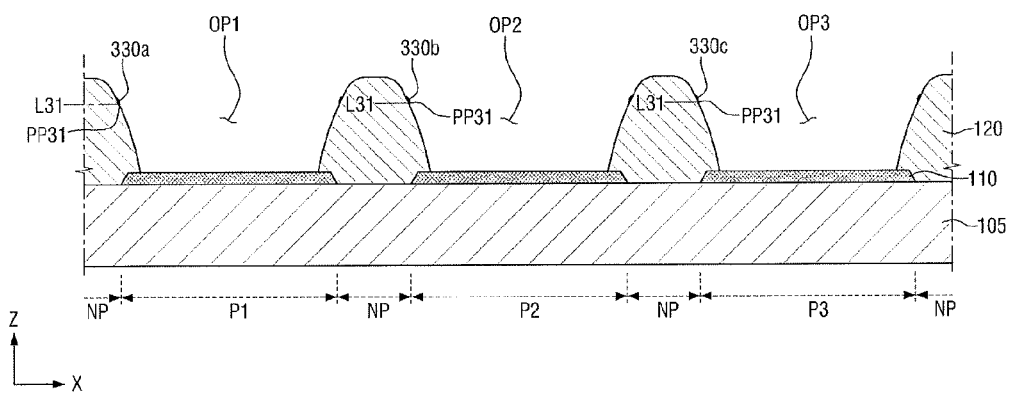

To form the first through third lyophobic patterns 330a through 330c of the light-emitting display device 300 of FIGS. 7 and 8, the first through third openings OP1 through OP3 of the pixel defining layer 120 may be filled with the first solvent 10d up to the first location L31 on the side surfaces of the pixel defining layer 120 based on the height of the pixel defining layer 120 by using a spin coating method or a slit coating method as illustrated in FIG. 15. Then, the second solvent 20d may be ejected onto the first solvent 10d using an inkjet printing method as illustrated in FIG. 16. Finally, the second solvent 20d and the first solvent 10d may be dried sequentially, thereby leaving the lyophobic insulating material. Accordingly, referring to FIG. 17, the first through third lyophobic patterns 330a through 330c may be formed of the remaining lyophobic insulating material at the first location L31 on the side surfaces of the pixel defining layer 120 in the first through third openings OP1 through OP3 of the pixel defining layer 120. The first through third lyophobic patterns 330a through 330c may cause pinning points PP31 to be formed at the same location on the side surfaces of the pixel defining layer 120 in the first through third openings OP1 through OP3 of the pixel defining layer 120, respectively.

Figure 18:
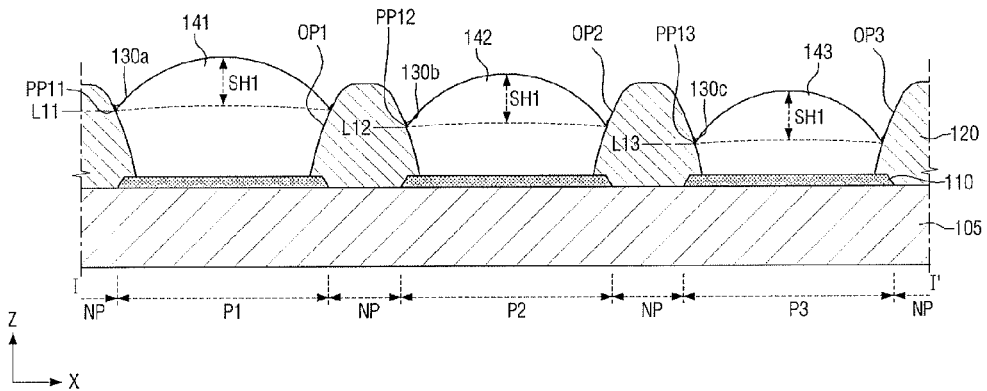
Figure 19:
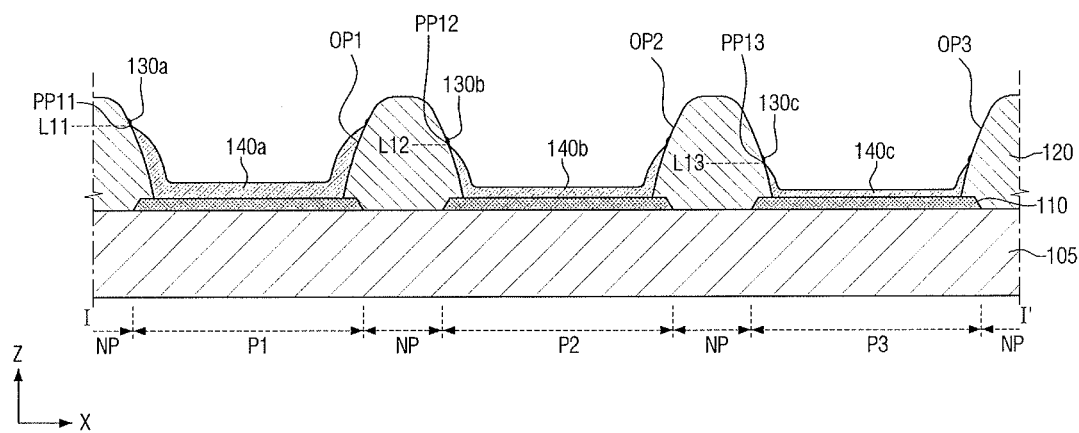

Referring to FIGS. 18 and 19, first through third hole injection layers 140a through 140c may be formed along the first electrodes 110 and the side surfaces of the pixel defining layer 120 under the first through third pinning points PP11 through PP13 in the first through third openings OP1 through OP3 of the pixel defining layer 120, respectively.

Referring to FIG. 18, a first hole injection solution 141 having a first volume, a second hole injection solution 142 having a second volume, and a third hole injection solution 143 having a third volume may respectively be ejected into the first through third openings OP1 through OP3 of the pixel defining layer 120 such that a maximum height between the first pinning point PP11 and a surface of the first hole injection solution 141 in the first opening OP1 of the pixel defining layer 120, a maximum height between the second pinning point PP12 and a surface of the second hole injection solution 142 in the second opening OP2, and a maximum height between the third pinning point PP13 and a surface of the third hole injection solution 143 in the third opening OP3 are all equal to SH1. The first volume may be greater than the second volume, and the second volume may be greater than the third volume.

Next, the first hole injection solution 141 having the first volume, the second hole injection solution 142 having the second volume, and the third hole injection solution 143 having the third volume may be dried in drying processes under the same conditions, and the first through third hole injection layers 140a through 140c may respectively be formed in the first through third openings OP1 through OP3 of the pixel defining layer 120 as illustrated in FIG. 19.

Figure 20:
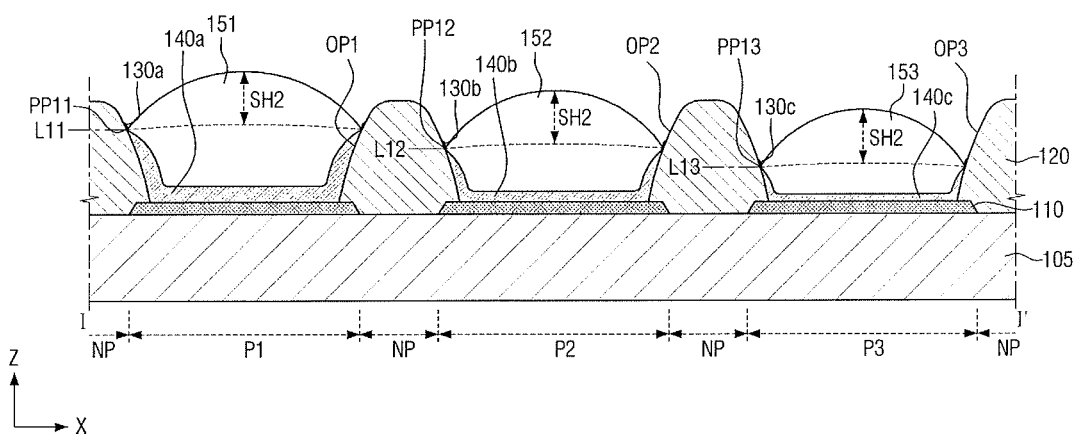
Figure 21:
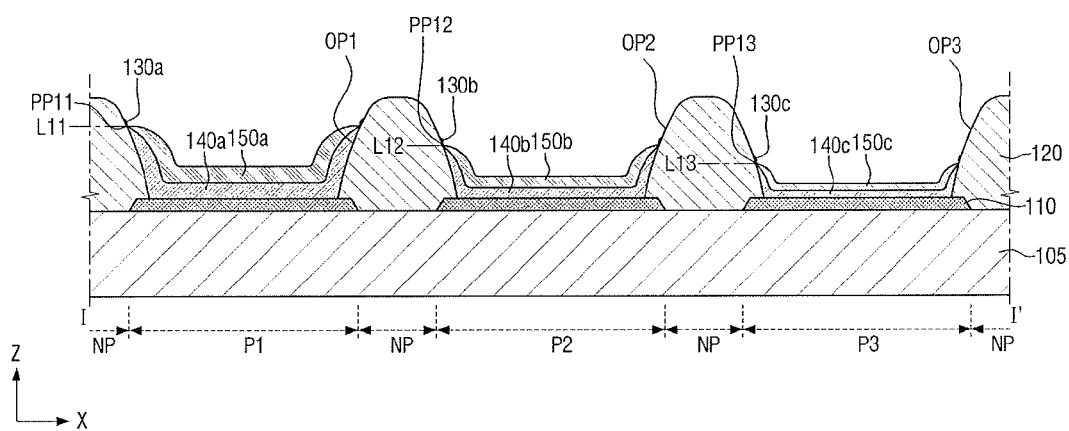

Referring to FIGS. 20 and 21, first through third hole transport layers 150a through 150c may be formed along the first electrodes 110 and the side surfaces of the pixel defining layer 120 under the first through third pinning points PP11 through PP13 in the first through third openings OP1 through OP3 of the pixel defining layer 120, respectively.

Referring to FIG. 20, a first hole transport solution 151 having a first volume, a second hole transport solution 152 having a second volume, and a third hole transport solution 153 having a third volume may respectively be ejected into the first through third openings OP1 through OP3 of the pixel defining layer 120 such that a maximum height between the first pinning point PP11 and a surface of the first hole transport solution 151 in the first opening OP1 of the pixel defining layer 120, a maximum height between the second pinning point PP12 and a surface of the second hole transport solution 152 in the second opening OP2, and a maximum height between the third pinning point PP13 and a surface of the third hole transport solution 153 in the third opening OP3 are all equal to SH2. The first volume may be greater than the second volume, and the second volume may be greater than the third volume.

Next, the first hole transport solution 151 having the first volume, the second hole transport solution 152 having the second volume, and the third hole transport solution 153 having the third volume may be dried in drying processes under the same conditions, and the first through third hole transport layers 150a through 150c may respectively be formed in the first through third openings OP1 through OP3 of the pixel defining layer 120 as illustrated in FIG. 21.

Figure 22:
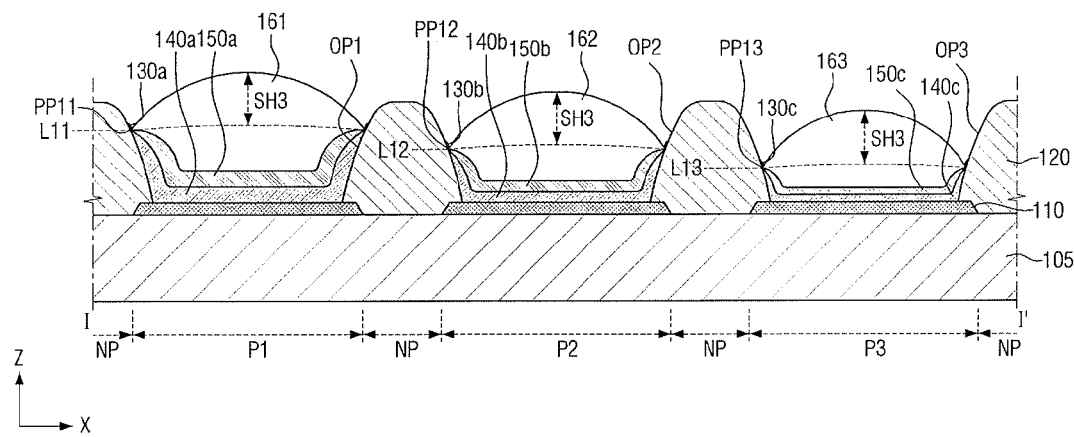
Figure 23:
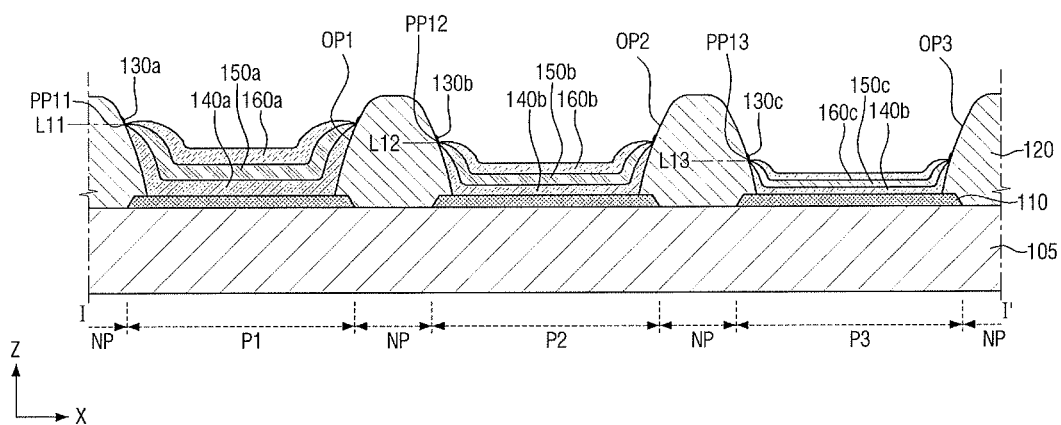

Referring to FIGS. 22 and 23, first through third light-emitting layers 160a through 160c may be formed along the first electrodes 110 and the side surfaces of the pixel defining layer 120 under the first through third pinning points PP11 through PP13 in the first through third openings OP1 through OP3 of the pixel defining layer 120, respectively.

Referring to FIG. 22, a first light-emitting solution 161 having a first volume, a second light-emitting solution 162 having a second volume, and a third light-emitting solution 163 having a third volume may respectively be ejected into the first through third openings OP1 through OP3 of the pixel defining layer 120 such that a maximum height between the first pinning point PP11 and a surface of the first light-emitting solution 161 in the first opening OP1 of the pixel defining layer 120, a maximum height between the second pinning point PP12 and a surface of the second light-emitting solution 162 in the second opening OP2, and a maximum height between the third pinning point PP13 and a surface of the third light-emitting solution 163 in the third opening OP3 are all equal to SH3. The first volume may be greater than the second volume, and the second volume may be greater than the third volume.

Next, the first light-emitting solution 161 having the first volume, the second light-emitting solution 162 having the second volume, and the third light-emitting solution 163 having the third volume may be dried in drying processes under the same conditions, and the first through third light-emitting layers 160a through 160c may respectively be formed in the first through third openings OP1 through OP3 of the pixel defining layer 120 as illustrated in FIG. 23.

Figure 24:
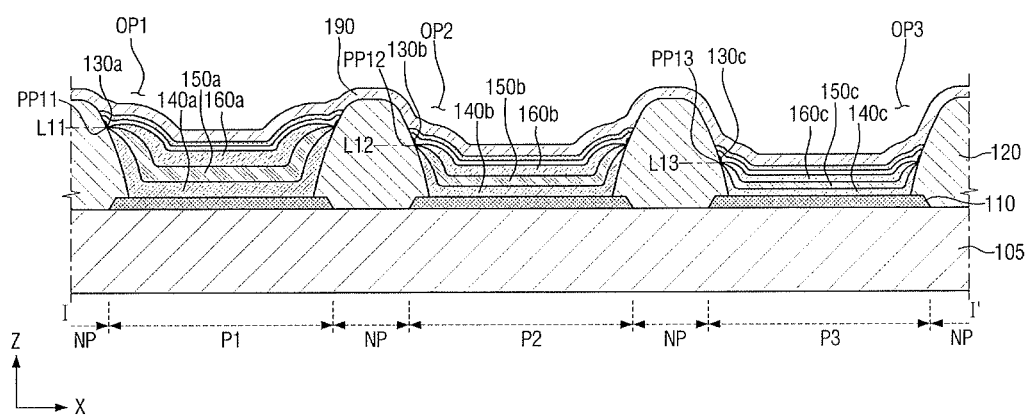

Referring to FIG. 24, first through third electron transport layers 170a through 170c, first through third electron injection layers 180a through 180c, and a second electrode 190 may sequentially be formed on the first through third light-emitting layers 160a through 160c using a deposition method.

The method of manufacturing a light-emitting display device according to the current embodiment may further include placing an encapsulation substrate on the second electrode 190. The method of manufacturing a light-emitting display device according to the current embodiment may include placing a spacer between the second electrode 190 and the encapsulation substrate. Various methods of placing the encapsulation substrate and the spacer may be readily determined by those of skill in the art, and a detailed description thereof is omitted.

By way of summation and review, an organic light-emitting display device may include a pixel defining layer formed on a substrate having a plurality of pixels arranged in a matrix. The pixel defining layer may have an opening that exposes the anode formed in each of the pixels. The hole injection layer, the hole transport layer, the organic light-emitting layer, the electron transport layer, the electron injection layer, and the cathode may be formed on the anode exposed through the opening of the pixel defining layer. For example, each of the hole injection layer, the hole transport layer and the organic light-emitting layer may be formed as a pattern layer in the form of a thin film by ejecting a solution into the opening of the pixel defining layer using a solution coating method such as an inkjet printing method and drying the ejected solution.

The pixel defining layer may be made of a lyophobic material that may prevent the solution ejected into the opening of the pixel defining layer from flowing out of the opening of the pixel defining layer.

In an example, the pixel defining layer may include a lyophilic area formed in a lower part of a side surface thereof in the opening and a lyophobic area formed in an upper part of the side surface thereof in the opening. The pixel defining layer may be formed by depositing a lyophobic insulating material on the substrate, patterning the lyophobic insulating material to form the opening, and forming the lyophilic area by irradiating light (e.g., ultraviolet light) to the lower part of the side surface of the pixel defining layer in the opening. A solution ejected into the opening of the pixel defining layer may not be able to flow out of the lyophobic area based on a pinning point which may be a boundary between the lyophilic area and the lyophobic area and may be formed as a pattern layer in the lyophilic area located under the pinning point when dried in a drying process. In the process of irradiating light, light may be irradiated to an undesired location due to, for example, the scattering of the light. The pinning point formed between the lyophilic area and the lyophobic area by irradiating light to the pixel defining layer may be disposed at an undesired location in the pixel defining layer, and a pattern layer having an undesired thickness may be formed at an undesired location.

The pixel defining layer may include a lyophilic first pixel defining layer and a lyophobic second pixel defining layer formed on the first pixel defining layer. A photolithography process for forming the first pixel defining layer and another photolithography process for forming the second pixel defining layer may be required, which may complicate a process of manufacturing a light-emitting display device.

Provided is a light-emitting display device in which a pattern layer having a desired thickness may be easily formed at a desired location and which may be manufactured in a simplified manner. Also provided is a method of manufacturing a light-emitting display device in which a pattern layer having a desired thickness may be easily formed at a desired location and which may be manufactured in a simplified manner.

A light-emitting display device according to an embodiment may include a lyophobic pattern disposed at a predetermined height on a side surface of a pixel defining layer in an opening of the pixel defining layer. Therefore, a pinning point may be formed at a desired location. When at least one of elements of an organic layer, for example, a light-emitting layer is formed using an inkjet printing method, the pinning point may prevent a light-emitting solution from flowing out of the opening of the pixel defining layer and fix the location of the light-emitting layer formed by drying the light-emitting solution.

Therefore, the light-emitting display device may have improved display quality because the light-emitting layer having a desired thickness may be formed at a desired location based on the pinning point. A manufacturing process may be simpler than when a pinning point is formed by forming a lyophilic pixel defining layer and a lyophobic pixel defining layer through two photolithography processes. Furthermore, it may be possible to reduce a reduction in the characteristics and life of a light-emitting layer of an organic layer due to, for example, the diffusion of fluorine in a light-emitting display device having a pixel defining layer, the whole of which is lyophobic.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light-emitting display device, comprising:
a substrate including a plurality of pixels;
a first electrode on the substrate in each of the pixels;
a pixel defining layer on the substrate, the pixel defining layer having an opening exposing the first electrode and including a side surface having a first part, a second part located on the first part, and a boundary part located between the first part and the second part;
a lyophobic pattern in the boundary part of the side surface of the pixel defining layer in the opening of the pixel defining layer, the lyophobic pattern being a ring pattern;
an organic layer on the first electrode, the organic layer including a light-emitting layer under the lyophobic pattern in the opening of the pixel defining layer; and
a second electrode on the organic layer.

2. The display device as claimed in claim 1, wherein the lyophobic pattern contacts an end of the light-emitting layer.

3. The display device as claimed in claim 1, wherein the lyophobic pattern includes an insulating material that contains fluorine.

4. The display device as claimed in claim 1, wherein the organic layer further includes one or more of a hole injection layer between the first electrode and the light-emitting layer and under the lyophobic pattern in the opening of the pixel defining layer, a hole transport layer between the hole injection layer and the light-emitting layer and under the lyophobic pattern in the opening of the pixel defining layer, an electron transport layer between the light-emitting layer and the second electrode, or an electron injection layer between the electron transport layer and the second electrode.

5. The display device as claimed in claim 1, wherein the pixel defining layer includes an organic material or an inorganic material.

6. A light-emitting display device, comprising:
a substrate including a first pixel and a second pixel;
a first electrode on the substrate in each of the first and second pixels;
a pixel defining layer on the substrate, the pixel defining layer having a first opening exposing the first electrode of the first pixel and a second opening exposing the first electrode of the second pixel;
a first lyophobic pattern in the first opening of the pixel defining layer and at a first location on a side surface of the pixel defining layer, the first location being relative to a height of the pixel defining layer;

a second lyophobic pattern in the second opening of the pixel defining layer and at a second location on the side surface of the pixel defining layer, the second location being relative to the height of the pixel defining layer, the second location being lower than the first location;

a first organic layer including a first light-emitting layer under the first lyophobic pattern in the first opening of the pixel defining layer;

a second organic layer including a second light-emitting layer under the second lyophobic pattern in the second opening of the pixel defining layer, a thickness of the second organic layer being less than a thickness of the first organic layer; and a second electrode on the first organic layer and the second organic layer.

7. The display device as claimed in claim 6, wherein each of the first lyophobic pattern and the second lyophobic pattern is formed as a ring pattern.

8. The display device as claimed in claim 6, wherein:
the first lyophobic pattern contacts an end of the first light-emitting layer, and
the second lyophobic pattern contacts an end of the second light-emitting layer.

9. The display device as claimed in claim 6, wherein each of the first lyophobic pattern and the second lyophobic pattern includes an insulating material that contains fluorine.

10. The display device as claimed in claim 6, wherein:
the second location and the first location are at a same height relative to the height of the pixel defining layer; and
a thickness of the second organic layer is equal to a thickness of the first organic layer.

11. The display device as claimed in claim 6, wherein the first pixel and the second pixel emit light of different colors.

12. The display device as claimed in claim 6, wherein the pixel defining layer includes an organic material or an inorganic material.

13. A method of manufacturing a light-emitting display device, the method comprising:
forming a first electrode on a substrate having a plurality of pixels in each of the pixels;
forming a pixel defining layer on the substrate, the pixel defining layer having an opening exposing the first electrode and a side surface including a first part, a second part located on the first part, and a boundary part located between the first part and the second part;
forming a lyophobic pattern in the boundary part of the side surface of the pixel defining layer in the opening of the pixel defining layer;
forming an organic layer, the organic layer including a light-emitting layer under the lyophobic pattern in the opening of the pixel defining layer, on the first electrode; and
forming a second electrode on the organic layer, wherein forming the lyophobic pattern includes:

filling the opening of the pixel defining layer with a first solvent up to a first location between the first part and the boundary part;
ejecting a second solvent mixed with a fluorine-containing insulating material onto the first solvent;
agglomerating the fluorine-containing insulating material at the first location by drying the second solvent; and
having a pinning point formed by the lyophobic pattern formed at the first location by drying the first solvent.

14. The method as claimed in claim 13, wherein:
the first solvent is non-polar, and
the second solvent is polar.

15. The method as claimed in claim 13, wherein:
the pixels include a first pixel and a second pixel, the opening of the pixel defining layer is divided into a first opening exposing the first electrode formed in the first pixel and a second opening exposing the first electrode formed in the second pixel,
filling the opening includes filling the first opening of the pixel defining layer with the first solvent up to the first location on a side surface of the pixel defining layer, the first location being relative to a height of the pixel defining layer, and filling the second opening of the pixel defining layer with the first solvent up to a second location on the side surface of the pixel defining layer, the second location being relative to the height of the pixel defining layer;
ejecting the second solvent onto the first solvent includes ejecting the second solvent in each of the first opening of the pixel defining layer and the second opening of the pixel defining layer;
and
having a pinning point includes having a first pinning point formed by a first lyophobic pattern formed at the first location and a second pinning point formed by a second lyophobic pattern formed at the second location by drying the first solvent in each of the first opening of the pixel defining layer and the second opening of the pixel defining layer.

16. The method as claimed in claim 15, wherein forming the light-emitting layer of the organic layer includes ejecting a first light-emitting solution into the first opening and a second light-emitting solution into the second opening by adjusting a volume of the first light-emitting solution and a volume of the second light-emitting solution such that a maximum height between the first pinning point and a surface of the first light-emitting solution in the first opening is equal to a maximum height between the second pinning point and a surface of the second light-emitting solution in the second opening.

17. The method as claimed in claim 15, wherein:
the first solvent in each of the first opening of the pixel defining layer and the second opening of the pixel defining layer is non-polar, and
the second solvent is polar.

* * * * *